(12) United States Patent
Takaishi

(10) Patent No.: US 8,766,317 B2
(45) Date of Patent: Jul. 1, 2014

(54) SEMICONDUCTOR DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 437 days.

(21) Appl. No.: 12/665,538

(22) PCT Filed: Jun. 17, 2008

(86) PCT No.: PCT/JP2008/061019
§ 371 (c)(1),
(2), (4) Date: Dec. 18, 2009

(87) PCT Pub. No.: WO2008/156070
PCT Pub. Date: Dec. 24, 2008

(65) Prior Publication Data
US 2010/0193837 A1    Aug. 5, 2010

(30) Foreign Application Priority Data

Jun. 18, 2007  (JP) .................................. 2007-160235
Jun. 18, 2007  (JP) .................................. 2007-160242
Jun. 18, 2007  (JP) .................................. 2007-160245

(51) Int. Cl.
    *H01L 29/66*    (2006.01)
(52) U.S. Cl.
    USPC ........... 257/135; 257/220; 257/242; 257/263; 257/328; 257/329; 257/E29.201; 257/E29.257; 257/E21.655
(58) Field of Classification Search
    None
    See application file for complete search history.

(56) References Cited

U.S. PATENT DOCUMENTS

| 5,132,238 | A  |   | 7/1992  | Murakami et al. |         |
|-----------|----|---|---------|-----------------|---------|
| 5,177,572 | A  |   | 1/1993  | Murakami        |         |
| 5,324,966 | A  | * | 6/1994  | Muraoka et al.  | 257/136 |
| 5,572,048 | A  |   | 11/1996 | Sugawara        |         |
| 5,679,966 | A  | * | 10/1997 | Baliga et al.   | 257/139 |
| 6,400,026 | B1 |   | 6/2002  | Andou et al.    |         |
| 2001/0041407 | A1 | * | 11/2001 | Brown | 438/270 |
| 2003/0102486 | A1 |   | 6/2003  | Inoue et al. |    |
| 2003/0201455 | A1 | * | 10/2003 | Takahashi et al. | 257/136 |
| 2004/0119103 | A1 | * | 6/2004  | Thapar          | 257/270 |
| 2005/0263853 | A1 | * | 12/2005 | Tomomatsu et al. | 257/565 |
| 2006/0011962 | A1 | * | 1/2006  | Kocon           | 257/302 |
| 2007/0138546 | A1 | * | 6/2007  | Kawamura et al. | 257/330 |
| 2010/0176443 | A1 |   | 7/2010  | Takaishi        |         |
| 2010/0181606 | A1 |   | 7/2010  | Takaishi        |         |

FOREIGN PATENT DOCUMENTS

| EP | 0 339 962    | 11/1989 |
|----|--------------|---------|
| JP | 53-41985     | 4/1978  |
| JP | 55-108768    | 8/1980  |
| JP | 57-172765    | 10/1982 |
| JP | 2-015677     | 1/1990  |
| JP | 3-289141     | 12/1991 |
| JP | 03-289176 A  | 12/1991 |
| JP | 05-048117 A  | 2/1993  |
| JP | 06-163907 A  | 6/1994  |

(Continued)

*Primary Examiner* — Fei Fei Yeung Lopez
(74) *Attorney, Agent, or Firm* — Fish & Richardson P.C.

(57) ABSTRACT

Provided is a semiconductor device in which on-resistance is largely reduced based on a new principle of operation. In the semiconductor device, if an embedded electrode is at negative potential, a depletion layer is formed from a trench to a neighboring trench so that a channel is turned off. If the embedded electrode is at a positive potential, the depletion layer is not formed in every region between the neighboring trenches so that the channel is turned on.

17 Claims, 20 Drawing Sheets

(56) References Cited

FOREIGN PATENT DOCUMENTS

| JP | 06-326319 A | 11/1994 |
|----|----|----|
| JP | 7-335868 | 12/1995 |
| JP | 08-213613 | 8/1996 |
| JP | 9-321292 | 12/1997 |
| JP | 2000-332239 | 11/2000 |
| JP | 2001-007149 A | 1/2001 |
| JP | 2001-168333 | 6/2001 |
| JP | 2003-533889 A | 11/2003 |
| JP | 2004-55968 | 2/2004 |
| JP | 2004-146679 | 5/2004 |
| WO | WO 01/88997 | 11/2001 |

\* cited by examiner

SEMICONDUCTOR DEVICE

TECHNICAL FIELD

The present invention relates to a semiconductor device, and more particularly, to a semiconductor device having a switching function.

BACKGROUND ART

Conventionally, a metal oxide semiconductor field effect transistor (MOSFET) is known as a semiconductor device having a switching function (see, for example, Patent Document 1). The Patent Document 1 discloses a trench gate MOSFET (semiconductor device) in which a gate electrode is embedded in a trench formed in a semiconductor layer.

FIG. 31 is a cross sectional view illustrating a structure of a conventional MOSFET (semiconductor device) disclosed in the Patent Document 1. With reference to FIG. 31, the conventional MOSFET includes an N$^+$ type semiconductor substrate 501 and an epitaxial layer 502 formed on the upper surface of the semiconductor substrate 501. This epitaxial layer 502 includes an N$^-$ type impurity region (drain region) 502a, a P type impurity region 502b and an N$^+$ type impurity region (source region) 502c formed in this order from the semiconductor substrate 501 side. In addition, the N$^+$ type impurity region 502c is formed in a predetermined region on the P type impurity region 502b, so that both the P type impurity region 502b and the N$^+$ type impurity region 502c contact with the source electrode 507 that will be described later.

In addition, in the epitaxial layer 502, there is formed a trench 503 that penetrates the N$^+$ type impurity region 502c and the P type impurity region 502b so as to reach a halfway depth of the N$^-$ type impurity region 502a. A gate electrode 505 is formed inside the trench 503 via the gate insulator film 504. In addition, in a predetermined region on the upper surface of the epitaxial layer 502, there is formed an interlayer insulator film 506 that closes an opening of the trench 503.

In addition, on the upper surface of the epitaxial layer 502, there is formed a source electrode 507 so as to cover the interlayer insulator film 506. In addition, a drain electrode 508 is formed on the back surface of the semiconductor substrate 501.

In the conventional MOSFET having the structure described above, the applied voltage to the gate electrode 505 is changed for controlling on and off.

Specifically, when a predetermined positive potential is applied to the gate electrode 505, minority carrier (electrons) in the P type impurity region 502b is attracted to the trench 503 side, so there is formed an inversion layer 509 that connects the N$^-$ type impurity region (drain region) 502a with the N$^+$ type impurity region (source region) 502c. Thus, current can flow between the source electrode 507 and the drain electrode 508 via the inversion layer 509. As a result, the MOSFET is turned on. In other words, the conventional MOSFET makes the inversion layer 509 function as a channel, which is formed to connect the N$^-$ type impurity region (drain region) 502a with the N$^+$ type impurity region (source region) 502c.

In contrast, when the application of the predetermined positive potential to the gate electrode 505 is stopped, the inversion layer (channel) 509 is deleted so that the current flowing between the source electrode 507 and the drain electrode 508 can be interrupted. As a result, the MOSFET is turned off.

Patent Document 1: JP-A-2001-7149

DISCLOSURE OF THE INVENTION

Problem to be Solved by the Invention

However, the conventional structure illustrated in FIG. 31 has a disadvantage that the inversion layer (channel) 509 that is formed in the turned-on state is so thin that it is difficult to reduce resistance against the current flowing through the inversion layer (channel) 509. As a result, there is a problem that it is difficult to improve on-resistance.

The present invention is created to solve the above-mentioned problem, and it is an object of the present invention to provide a semiconductor device that can largely reduce on-resistance based on a new principle of operation.

Means for Solving the Problem

In order to achieve the above-mentioned purpose, a semiconductor device according to a first aspect of the present invention includes a first semiconductor layer of a first conductivity type, a second semiconductor layer of a second conductivity type having a plurality of trenches disposed on the first semiconductor layer, and a plurality of embedded electrodes buried in the plurality of trenches of the second semiconductor layer. The first semiconductor layer and the second semiconductor layer constitute a PN diode, each region between neighboring trenches becomes a channel, and each region between the neighboring trenches is blocked with a depletion layer formed around the trench so that the channel is interrupted, while at least a part of the depletion layer formed around the trench is deleted so that the channel is opened.

In the semiconductor device according to the first aspect, as described above, each region between the neighboring trenches is blocked with the depletion layer formed around the trench so that the channel (each region between the neighboring trenches) is interrupted, while at least a part of the depletion layer formed around the trench is deleted so that the channel (each region between the neighboring trenches) is opened. For instance, if the embedded electrode is formed on the inner surface of the trench via an insulator film, a formation state of the depletion layer formed around the trench changes in accordance with applied voltage to the embedded electrode. Therefore, by controlling the applied voltage to the embedded electrode, it is possible to control the channel between the neighboring trenches to be the turned-off state (in which current flowing through the channel is interrupted) or to be the turned-on state (in which current flows through the channel). In other words, the semiconductor device can have a switching function. Further, in the above-mentioned structure, in the turned-on state, the entire region of each region between the neighboring trenches in which the depletion layer is not formed can function as a channel. Therefore, compared with the conventional semiconductor device (MOSFET) in which a very thin inversion layer functions as a channel, resistance against current flowing through the channel can be reduced largely. Thus, compared with the conventional semiconductor device, on-resistance can be reduced largely.

In addition, in the semiconductor device according to the first aspect, as described above, the first semiconductor layer and the second semiconductor layer constitute the PN diode, so if a forward direction voltage is applied to the PN diode constituted of the first semiconductor layer and the second semiconductor layer, the PN diode can be controlled to permit or not to permit the current to flow by the above-mentioned switching function. Thus, by controlling the applied voltage to the embedded electrode, it is possible to control on and off of the PN diode regardless of potentials to be applied to the first semiconductor layer and the second semiconductor layer. As a result, it is not necessary to provide another switching mechanism for controlling on and off of the PN diode and to connect the semiconductor device to the switching mechanism, so that an increase in size of the entire device can be suppressed.

In addition, in the semiconductor device according to the first aspect, as described above, by providing the first semiconductor layer of the first conductivity type and the second semiconductor layer of the second conductivity type disposed on the first semiconductor layer, it is possible to prevent a PNPN structure or a NPNP structure from being formed. Therefore, it is possible to prevent a formation of a thyristor as a combination of a PNP transistor and an NPN transistor like an insulated gate bipolar transistor (IGBT). Thus, it is possible to prevent occurrence of latch-up so that the semiconductor device can be used as an IGBT that permits more current to flow.

In the semiconductor device according to the first aspect, preferably, when the embedded electrode is at a first potential, the depletion layer is formed from the trench to a neighboring trench, so that current flowing through the channel is interrupted. When the embedded electrode is at a second potential, the depletion layer is not formed in at least a part of the region between the neighboring trenches so that current can flow through the channel. Thus, by applying the first potential or the second potential to the embedded electrode, the channel between the neighboring trenches can easily be controlled to be the turned-off state (in which the current flowing through the channel is interrupted), or to be the turned-on state (in which the current can flow through the channel).

In the semiconductor device described above in which the current flowing through the channel is interrupted if the embedded electrode is at the first potential while the current flows through the channel if the embedded electrode is at the second potential, preferably, if the second semiconductor layer is an N type semiconductor layer, the second potential is higher than the first potential. If the second semiconductor layer is a P type semiconductor layer, the second potential is lower than the first potential. With this structure, if the embedded electrode is at the first potential, it is easy to form the depletion layer from the trench to the neighboring trenches so that the channel between the neighboring trenches becomes the turned-off state (in which the current flowing through the channel is interrupted). If the embedded electrode is at the second potential, it is easy not to form the depletion layer in at least a part of the region between the neighboring trenches so that the channel becomes the turned-on state (in which the current can flow through the channel).

In the semiconductor device described above in which the current flowing through the channel is interrupted if the embedded electrode is at the first potential while the current flows through the channel if the embedded electrode is at the second potential, preferably, if the embedded electrode is at the first potential, the depletion layer is formed around each of the plurality of trenches, and the depletion layers are connected to each other so as to block each region between the neighboring trenches. With this structure, if the embedded electrode is at the first potential, it is easy to form the depletion layer from the trench to the neighboring trenches. Thus, by setting the embedded electrode to the first potential, the channel can easily be turned off (in which the current flowing through the channel is interrupted).

In the semiconductor device according to the first aspect, preferably, the trench is formed in the second semiconductor layer so as not to reach the first semiconductor layer. With this structure, it is possible to prevent the depth of the trench from being too large, so that the trench can easily be formed in the second semiconductor layer.

The semiconductor device according to the first aspect, preferably, further includes a wiring layer disposed on the second semiconductor layer, and on the wiring layer side of the second semiconductor layer, there is formed a high concentration impurity region having impurity concentration higher than that of the part of the second semiconductor layer on the side of the first semiconductor layer. With this structure, the second semiconductor layer can easily have an ohmic contact with the wiring layer, so that on-resistance can easily be reduced more.

The semiconductor device according to the first aspect may have the structure in which each region between the neighboring trenches is blocked with every depletion layer formed around each of the plurality of trenches so that the channel interrupted, while every depletion layer formed around each of the plurality of trenches is deleted so that the channel is opened.

The semiconductor device according to the first aspect may have the structure in which the plurality of embedded electrodes include two types that are first embedded electrodes and second embedded electrodes to which voltages are applied separately, and each region between the neighboring trenches is blocked with the depletion layer formed around every trench among the plurality of trenches so that the channel is interrupted, while the depletion layer formed around the trench buried with the first embedded electrode among the plurality of trenches is deleted so that the channel is opened.

In this case, the second embedded electrode may have a Schottky contact with the second semiconductor layer inside the trench.

The semiconductor device according to the first aspect may further include a diffusion layer of the first conductivity type that is formed in each region between the neighboring trenches of the second semiconductor layer so as to be disposed with a predetermined space to the trench. Each region between the neighboring trenches is blocked with depletion layers formed around the trench and around the diffusion layer so that the channel is interrupted, while the depletion layer formed around the trench is deleted so that the channel is opened.

In addition, a semiconductor device according to a second aspect of the present invention includes a third semiconductor layer of a third conductivity type, a fourth semiconductor layer made of intrinsic semiconductor having a plurality of trenches disposed on the third semiconductor layer, a fifth semiconductor layer of a fourth conductivity type disposed on the fourth semiconductor layer, and a plurality of embedded electrodes buried in the plurality of trenches of the fourth semiconductor layer. The third semiconductor layer, the fourth semiconductor layer and the fifth semiconductor layer constitute a PIN diode. Each region between the neighboring trenches becomes a channel. Each region between the neighboring trenches is blocked with a depletion layer formed around the trench so that the channel is interrupted, while at least a part of the depletion layer formed around the trench is deleted so that the channel is opened. Note that in this specification "intrinsic semiconductor" means a wide concept including not only a semiconductor containing no impurity but also a semiconductor containing low concentration of impurity that can constitute an I-layer of the PIN diode.

In the semiconductor device according to the second aspect, as described above, each region between the neighboring trenches is blocked with the depletion layer formed around the trench so that the channel (each region between the neighboring trenches) is interrupted, while at least a part of the depletion layer formed around the trench is deleted so that the channel (each region between the neighboring trenches) is opened. For instance, if the embedded electrode is formed on the inner surface of the trench via an insulator film, a formation state of the depletion layer formed around the trench changes in accordance with applied voltage to the embedded electrode. Therefore, by controlling the applied voltage to the embedded electrode, it is possible to control the channel between the neighboring trenches to be the turned-off state (in which current flowing through the channel is interrupted) or to be the turned-on state (in which current flows through the channel). In other words, the semiconductor device can have a switching function. Further, in the above-mentioned structure, in the turned-on state, the entire region of each region between the neighboring trenches in which the depletion layer is not formed can function as a channel. Therefore, compared with the conventional semiconductor device (MOSFET) in which a very thin inversion layer functions as a channel, resistance against current flowing through the channel can be reduced largely. Thus, compared with the conventional semiconductor device, on-resistance can be reduced largely.

In addition, in the semiconductor device according to the second aspect, as described above, the third semiconductor layer, the fourth semiconductor layer and the fifth semiconductor layer constitute the PIN diode. Thus, when a forward direction voltage is applied to the PIN diode constituted of the third semiconductor layer, the fourth semiconductor layer and the fifth semiconductor layer, the PIN diode can be controlled to permit or not to permit the current to flow by the above-mentioned switching function. Thus, regardless of potentials to be applied to the third semiconductor layer and the fifth semiconductor layer, it is possible to control on and off of the PIN diode by controlling the applied voltage to the embedded electrode. As a result, it is not necessary to provide an additional switching mechanism for controlling on and off of the PIN diode and to connect the semiconductor device to the switching mechanism. Therefore, an increase in size of the entire device can be suppressed.

In the semiconductor device according to the second aspect, preferably, if the embedded electrode is at the first potential, the depletion layer is formed from the trench to the neighboring trenches so that the current flowing through the channel is interrupted. If the embedded electrode is at the second potential, the depletion layer is not formed in at least a part of the region between the neighboring trenches so that current can flow through the channel. Thus, by applying the first potential or the second potential to the embedded electrode, the channel between the neighboring trenches can easily be controlled to be the turned-off state (in which the current flowing through the channel is interrupted) or to the turned-on state (in which the current can flow through the channel).

In the semiconductor device described above in which the current flowing through the channel is interrupted if the embedded electrode is at the first potential while the current flows through the channel if the embedded electrode is at the second potential, preferably, if the fourth semiconductor layer contains N type impurity, the second potential is higher than the first potential. If the fourth semiconductor layer contains P type impurity, the second potential is lower than the first potential. With this structure, if the embedded electrode is at the first potential, it is easy to form the depletion layer from the trench to the neighboring trenches, so that the channel between the neighboring trenches can be turned off (in which the current flowing through the channel is interrupted). If the embedded electrode is at the second potential, it is easy not to form the depletion layer in at least a part of the region between the neighboring trenches, so that the channel can be turned on (in which the current can flow through the channel).

In the semiconductor device described above in which the current flowing through the channel is interrupted if the embedded electrode is at the first potential while the current flows through the channel if the embedded electrode is at the second potential, preferably, if the embedded electrode is at the first potential, the depletion layer is formed around each of the plurality of trenches, and the depletion layers are connected to each other so as to block each region between the neighboring trenches. With this structure, if the embedded electrode is at the first potential, it is easy to form the depletion layer from the trench to the neighboring trenches. Thus, by setting the embedded electrode to the first potential, the channel can easily be turned off (in which the current flowing through the channel is interrupted).

In the semiconductor device according to the second aspect, preferably, the trench is formed in the fourth semiconductor layer without reaching the third semiconductor layer. With this structure, it is possible to prevent the depth of the trench from being too large, so that the trench can easily be formed in the fourth semiconductor layer.

The semiconductor device according to the second aspect, preferably, further includes a wiring layer disposed on the fifth semiconductor layer, and the fifth semiconductor layer includes a high concentration impurity region having impurity concentration higher than that of the fourth semiconductor layer. With this structure, the fifth semiconductor layer can easily have an ohmic contact with the wiring layer, so that on-resistance can easily be reduced more.

The semiconductor device according to the second aspect may have the structure in which each region between the neighboring trenches is blocked with every depletion layer formed around each of the plurality of trenches so that the channel is interrupted, while every depletion layer formed around each of the plurality of trenches is deleted so that the channel is opened.

The semiconductor device according to the second aspect may have the structure in which the plurality of embedded electrodes include two types that are third embedded electrodes and fourth embedded electrodes to which voltages are applied separately, and each region between the neighboring trenches is blocked with the depletion layer formed around every trench among the plurality of trenches so that the channel is interrupted, while the depletion layer formed around the trench buried with the third embedded electrode among the plurality of trenches is deleted so that the channel is opened.

In this case, the fourth embedded electrode may have a Schottky contact with the fourth semiconductor layer inside the trench.

The semiconductor device according to the second aspect may further include a diffusion layer of the third conductivity type that is formed in each region between the neighboring trenches of the fourth semiconductor layer so as to be disposed with a predetermined space to the trench. Each region between the neighboring trenches is blocked with depletion layers formed around the trench and around the diffusion layer so that the channel is interrupted, while the depletion layer formed around the trench is deleted so that the channel is opened.

In addition, a semiconductor device according to a third aspect of the present invention includes a sixth semiconductor layer of a fifth conductivity type, a seventh semiconductor layer of a sixth conductivity type disposed on the sixth semiconductor layer, an eighth semiconductor layer of the fifth conductivity type having a plurality of trenches disposed on the seventh semiconductor layer, and a plurality of embedded electrodes buried in the plurality of trenches of the eighth semiconductor layer. The sixth semiconductor layer, the seventh semiconductor layer and the eighth semiconductor layer constitute a bipolar transistor. Each region between neighboring trenches becomes a channel. Each region between the neighboring trenches is blocked with the depletion layer formed around the trench so that the channel is interrupted, while at least a part of the depletion layer formed around the trench is deleted so that the channel is opened.

In the semiconductor device according to the third aspect, as described above, each region between the neighboring trenches is blocked with the depletion layer formed around the trench so that the channel (each region between the neighboring trenches) is interrupted, while at least a part of the depletion layer formed around the trench is deleted so that the channel (each region between the neighboring trenches) is opened. For instance, if the embedded electrode is formed on the inner surface of the trench via an insulator film, a formation state of the depletion layer formed around the trench changes in accordance with applied voltage to the embedded electrode. Therefore, by controlling the applied voltage to the embedded electrode, it is possible to control the channel between the neighboring trenches to be the turned-off state (in which current flowing through the channel is interrupted) or to be the turned-on state (in which current flows through the channel). In other words, the semiconductor device can have a switching function. Further, in the above-mentioned structure, in the turned-on state, the entire region of each region between the neighboring trenches in which the depletion layer is not formed can function as a channel. Therefore, compared with the conventional semiconductor device (MOSFET) in which a very thin inversion layer functions as a channel, resistance against current flowing through the channel can be reduced largely. Thus, compared with the conventional semiconductor device, on-resistance can be reduced largely.

In addition, in the semiconductor device according to the third aspect, as described above, the sixth semiconductor layer, the seventh semiconductor layer and the eighth semiconductor layer constitute the bipolar transistor. Thus, when a voltage is applied to the bipolar transistor constituted of the sixth semiconductor layer, the seventh semiconductor layer and the eighth semiconductor layer, it is possible to control the bipolar transistor to permit or not to permit the current to flow by the above-mentioned switching function. Thus, regardless of potentials to be applied to the sixth semiconductor layer and the eighth semiconductor layer, on and off of the bipolar transistor can be controlled by controlling the applied voltage to the embedded electrode. As a result, it is not necessary to dispose an additional switching mechanism for controlling on and off of the bipolar transistor and to connect the semiconductor device to the switching mechanism. Therefore, an increase in size of the entire device can be suppressed.

In addition, in the semiconductor device according to the third aspect, as described above, by providing the sixth semiconductor layer of the fifth conductivity type, the seventh semiconductor layer of the sixth conductivity type disposed on the sixth semiconductor layer, and the eighth semiconductor layer of the fifth conductivity type disposed on the seventh semiconductor layer, it is possible to prevent a PNPN structure or an NPNP structure from being formed. Therefore, it is possible to prevent a formation of a thyristor as a combination of a PNP transistor and an NPN transistor like an insulated gate bipolar transistor (IGBT). Thus, it is possible to prevent occurrence of latch-up so that the semiconductor device can be used as an IGBT that permits more current to flow.

In the semiconductor device according to the third aspect, preferably, if the embedded electrode is at the first potential, the depletion layer is formed from the trench to the neighboring trenches so that the current flowing through the channel is interrupted. If the embedded electrode is at the second potential, the depletion layer is not formed in at least a part of the region between the neighboring trenches so that current can flow through the channel. Thus, by applying the first potential or the second potential to the embedded electrode, the channel between the neighboring trenches can easily be controlled to be the turned-off state (in which the current flowing through the channel is interrupted) or to the turned-on state (in which the current can flow through the channel).

In the semiconductor device described above in which the current flowing through the channel is interrupted if the embedded electrode is at the first potential while the current flows through the channel if the embedded electrode is at the second potential, preferably, if the eighth semiconductor layer is an N type semiconductor layer, the second potential is higher than the first potential. If the eighth semiconductor layer is a P type semiconductor layer, the second potential is lower than the first potential. With this structure, if the embedded electrode is at the first potential, it is easy to form the depletion layer from the trench to the neighboring trenches, so that the channel between the neighboring trenches can be turned off (in which the current flowing through the channel is interrupted). If the embedded electrode is at the second potential, it is easy not to form the depletion layer in at least a part of the region between the neighboring trenches, so that the channel can be turned on (in which the current can flow through the channel).

In the semiconductor device described above in which the current flowing through the channel is interrupted if the embedded electrode is at the first potential while the current flows through the channel if the embedded electrode is at the second potential, preferably, if the embedded electrode is at the first potential, the depletion layer is formed around each of the plurality of trenches, and the depletion layers are connected to each other so as to block each region between the neighboring trenches. With this structure, if the embedded electrode is at the first potential, it is easy to form the depletion layer from the trench to the neighboring trenches. Thus, by setting the embedded electrode to the first potential, the channel can easily be turned off (in which the current flowing through the channel is interrupted).

In the semiconductor device according to the third aspect, preferably, the trench is formed in the eighth semiconductor layer without reaching the seventh semiconductor layer. With this structure, it is possible to prevent the depth of the trench from being too large, so that the trench can easily be formed in the eighth semiconductor layer.

The semiconductor device according to the third aspect, preferably, further includes a wiring layer disposed on the eighth semiconductor layer, and on the wiring layer side of the eighth semiconductor layer, there is formed a high concentration impurity region having impurity concentration higher than that of the part of the eighth semiconductor layer on the side of the seventh semiconductor layer. With this structure, the eighth semiconductor layer can easily have an ohmic contact with the wiring layer, so that on-resistance can easily be reduced more.

The semiconductor device according to the third aspect may have the structure in which each region between the neighboring trenches is blocked with every depletion layer formed around each of the plurality of trenches so that the channel is interrupted, while every depletion layer formed around each of the plurality of trenches is deleted so that the channel is opened.

The semiconductor device according to the third aspect may have the structure in which the plurality of embedded electrodes include two types that are fifth embedded electrodes and sixth embedded electrodes to which voltages are applied separately, and each region between the neighboring trenches is blocked with the depletion layer formed around every trench among the plurality of trenches so that the channel is interrupted, while the depletion layer formed around the trench buried with the fifth embedded electrode among the plurality of trenches is deleted so that the channel is opened.

In this case, the sixth embedded electrode may have a Schottky contact with the eighth semiconductor layer inside the trench.

The semiconductor device according to the third aspect may further include a diffusion layer of the sixth conductivity type that is formed in each region between the neighboring trenches in the eighth semiconductor layer so as to be disposed with a predetermined space to the trench. Each region between the neighboring trenches is blocked with depletion layers formed around the trench and around the diffusion layer so that the channel is interrupted, while the depletion layer formed around the trench is deleted so that the channel is opened.

Effects of the Invention

As described above, according to the present invention, the semiconductor device that can largely reduce on-resistance based on a new principle of operation can easily be obtained.

Figure 1:
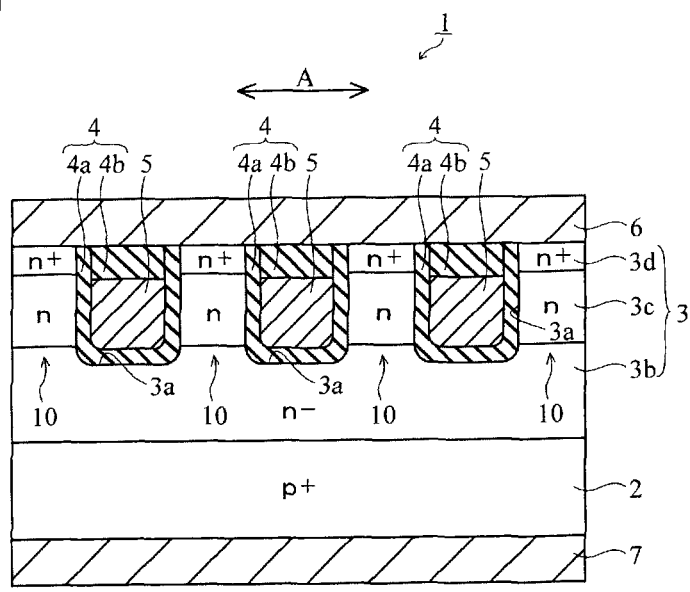
FIG. 1 is a cross sectional view illustrating a structure of a semiconductor device according to a first embodiment of the present invention.

EXPLANATION OF NUMERALS 1 semiconductor device
2 silicon substrate (first semiconductor layer)
3 semiconductor layer (second semiconductor layer)
3a trench
3d $N^+$ layer (high concentration impurity region)
4 insulator film
5 embedded electrode (first embedded electrode)
5a embedded electrode (second embedded electrode)
6, 66 electrode layer (wiring layer)
10 channel
11 depletion layer
45 $P^+$ type diffusion layer (diffusion layer)
66a embedded portion (second embedded electrode)
101 semiconductor device
102 silicon substrate (third semiconductor layer)
103 semiconductor layer (fourth semiconductor layer)
104 semiconductor layer (fifth semiconductor layer)
105 trench
106 insulator film
107 embedded electrode (third embedded electrode)
107a embedded electrode (fourth embedded electrode)
108, 168 electrode layer (wiring layer)
110 channel
111 depletion layer
147 $P^+$ type diffusion layer (diffusion layer)
168a embedded portion (fourth embedded electrode)
201 semiconductor device
202 silicon substrate (sixth semiconductor layer)
203 semiconductor layer (seventh semiconductor layer)
204 semiconductor layer (eighth semiconductor layer)
204a trench
204c $N^+$ layer (high concentration impurity region)
205 insulator film
206 embedded electrode (fifth embedded electrode)
206a embedded electrode (sixth embedded electrode)
207, 267 electrode layer (wiring layer)
210 channel
211 depletion layer
246 $P^+$ type diffusion layer (diffusion layer)
267a embedded portion (sixth embedded electrode)

BEST MODE FOR CARRYING OUT THE INVENTION

Hereinafter, embodiments of the present invention will be described with reference to the attached drawings.

First Embodiment

With reference to FIGS. 1 to 4, a structure of a semiconductor device 1 according to the first embodiment of the present invention will be described.

As illustrated in FIG. 1, the semiconductor device 1 according to the first embodiment of the present invention includes a silicon substrate 2 made of $P^+$ type semiconductor, a semiconductor layer 3 made of N type silicon having a plurality of trenches 3a that is disposed on the upper surface (principal surface) of the silicon substrate 2, a plurality of embedded electrodes 5 each of which is disposed on an inner surface of each of the plurality of trenches 3a in the semiconductor layer 3 via an insulator film 4, an electrode layer 6 made of a metal layer disposed on upper surfaces of the semiconductor layer 3 and the insulator film 4 (embedded electrode 5), and an electrode layer 7 made of a metal layer disposed on a lower surface of the silicon substrate 2. Note that the silicon substrate 2 is an example of the "first semiconductor layer" in the present invention, and the semiconductor layer 3 is an example of the "second semiconductor layer" in the present invention. In addition, the electrode layer 6 is an example of the "wiring layer" in the present invention. In addition, the P type ($P^+$ type) is an example of the "first conductivity type" in the present invention, and the N type ($N^+$ type, $N^-$ type) is an example of the "second conductivity type" in the present invention.

Here, in the first embodiment, the $P^+$ type silicon substrate 2 and the N type semiconductor layer 3 form a PN junction, so that the silicon substrate 2 and the semiconductor layer 3 constitute a PN diode.

P type impurity such as boron (B) is doped into the silicon substrate 2 at high concentration so that a doze amount becomes approximately $1 \times 10^{17}$ to $1 \times 10^{20}$ $cm^{-3}$. Thus, A lower surface of the silicon substrate 2 has an ohmic contact with the electrode layer 7.

The semiconductor layer 3 has a thickness of approximately 2 to 10 μm. In addition, each region between neighboring trenches 3a in the semiconductor layer 3 functions as a channel 10. In addition, the semiconductor layer 3 includes an $N^-$ layer 3b, an N layer 3c disposed on the $N^-$ layer 3b, and an $N^+$ layer 3d disposed on the entire surface of the N layer 3c.

In addition, in the first embodiment, the $N^+$ layer 3d has impurity concentration higher than that of the $N^-$ layer 3b and the N layer 3c. Thus, the $N^+$ layer 3d has an ohmic contact with the electrode layer 6. Specifically, N type impurity such as phosphorus (P) is doped in the $N^-$ layer 3b, the N layer 3c and the $N^+$ layer 3d so that doze amounts become approximately $1 \times 10^{14}$ to $1 \times 10^{18}$ $cm^{-3}$, approximately $5 \times 10^{15}$ to $1 \times 10^{17}$ $cm^{-3}$, and approximately $1 \times 10^{19}$ to $1 \times 10^{20}$ $cm^{-3}$, respectively. Note that the $N^+$ layer 3d is an example of the "high concentration impurity region" in the present invention.

In addition, in the first embodiment, the plurality of trenches 3a in the semiconductor layer 3 are formed at a pitch of approximately 0.4 to 2 μm in the A-direction. In addition, the plurality of trenches 3a are arranged with spaces of approximately 0.05 to 0.2 μm in the A-direction. In addition, the trench 3a has a depth of approximately 1 to 12 μm and is formed so as to penetrate the $N^+$ layer 3d and the N layer 3c from the upper surface of the semiconductor layer 3 ($N^+$ layer 3d) and to reach the $N^-$ layer 3b. In other words, the trench 3a is formed in the semiconductor layer 3 so as not to reach the silicon substrate 2. Note that the trench 3a may be formed so as to penetrate the semiconductor layer 3 and to reach the silicon substrate 2.

The insulator film 4 is made of $SiO_2$ or the like. In addition, the insulator film 4 includes a silicon oxide film 4a disposed to cover the inner surface of the trench 3a, and an interlayer insulator film 4b that is buried in the trench 3a to a vicinity of the upper end portion so as to cover the embedded electrode 5. The silicon oxide film 4a is formed by thermal processing of the semiconductor layer 3 so as to have a thickness of approximately 10 to 100 nm. In addition, the interlayer insulator film 4b has a thickness that is substantially the same or larger than the thickness of the $N^+$ layer 3d of the semiconductor layer 3.

The embedded electrode 5 is made of polysilicon. In addition, the lower surface of the embedded electrode 5 is positioned at substantially the same level as or lower than the lower surface of the N layer 3c in the semiconductor layer 3.

The electrode layer 6 is made of Al or the like and has an ohmic contact with the $N^+$ layer 3d of the semiconductor layer 3.

The electrode layer 7 is made of a metal multilayered film and has an ohmic contact with the silicon substrate 2.

Figure 2:
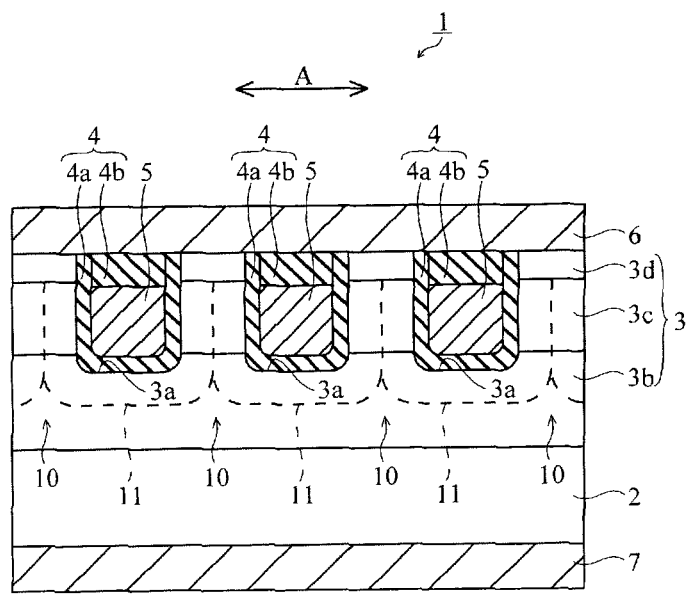
FIG. 2 is a cross sectional view illustrating a manner in which depletion layers are formed in a semiconductor layer of the semiconductor device according to the first embodiment illustrated in FIG. 1.

Here, in the first embodiment, when a negative potential is applied to the embedded electrode 5, as illustrated in FIG. 2, a depletion layer 11 having decreased majority carrier (electrons) is formed around every trench 3a (embedded electrode 5). Neighboring depletion layers 11 are connected and overlapped with each other so as to block each region between the neighboring trenches 3a (embedded electrodes 5), thereby the depletion layers 11 are formed from the trench 3a (embedded electrode 5) to the neighboring trenches 3a (embedded electrodes 5). In this case, the channel 10 between the neighboring trenches 3a (embedded electrodes 5) is blocked with the depletion layer 11 so as to be turned off (in which the current flowing through the channel 10 is interrupted). Therefore, current does not flow between the electrode layer 6 and the electrode layer 7 also when a negative potential is applied to the electrode layer 6 ($N^+$ layer 3d in the semiconductor layer 3) and a positive potential is applied to the electrode layer 7 (silicon substrate 2), i.e., when a forward direction voltage is applied to the PN diode. In other words, current does not flow in the PN diode.

In addition, in the first embodiment, when a positive potential is applied to the embedded electrode 5, as illustrated in FIG. 1, the depletion layer 11 (see FIG. 2) is not formed around the every trench 3a (embedded electrode 5). In other words, the depletion layer 11 formed around the trench 3a is deleted. In this case, in the first embodiment, the channel 10 is turned on (in which current flows through the channel 10) in every region between the neighboring trenches 3a (embedded electrodes 5). Therefore, when a negative potential is applied to the electrode layer 6 ($N^+$ layer 3d of the semiconductor layer 3) and a positive potential is applied to the electrode layer 7 (silicon substrate 2), i.e., when a forward direction voltage is applied to the PN diode, current flows between the electrode layer 6 and the electrode layer 7. In other words, current flows in the PN diode.

In this way, in the first embodiment, a formation state of the depletion layer 11 formed around the trench 3a (embedded electrode 5) changes in accordance with the applied voltage (potential) to the embedded electrode 5.

Figure 3:
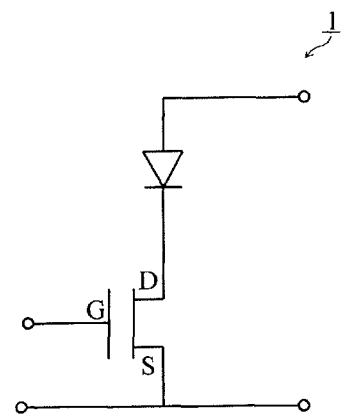
FIG. 3 is a diagram illustrating an equivalent circuit of the semiconductor device according to the first embodiment illustrated in FIG. 1.

In the first embodiment, it is supposed that the $N^-$ layer 3b of the semiconductor layer 3 is a drain (D), the $N^+$ layer 3d of the semiconductor layer 3 (electrode layer 6) is a source (S), and the embedded electrode 5 is a gate (G). Then, as illustrated in FIG. 3, the semiconductor device 1 can be regarded to have a circuit in which a switching mechanism (transistor constituted of the $N^-$ layer 3b, the $N^+$ layer 3d and the embedded electrode 5) is connected to the PN diode. In other words, the semiconductor device 1 can be used as a PN diode having a switching function.

Figure 4:
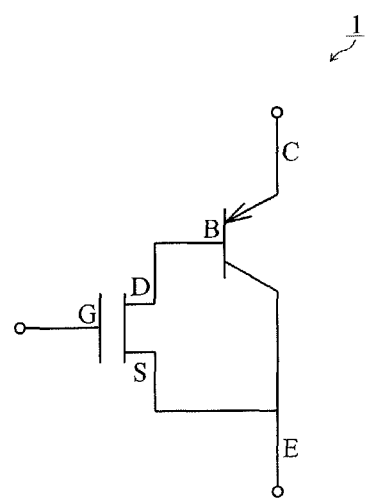
FIG. 4 is a diagram illustrating an equivalent circuit of the semiconductor device according to the first embodiment illustrated in FIG. 1.

On the other hand, in the first embodiment, it is supposed that the silicon substrate 2 (electrode layer 7) is a collector (C), the $N^-$ layer 3b of the semiconductor layer 3 is a drain (D) and a base (B), the $N^+$ layer 3d of the semiconductor layer 3 (electrode layer 6) is a source (S) and an emitter (E), and the embedded electrode 5 is a gate (G). Then, the semiconductor device 1 can be regarded to have a circuit that is equivalent to an IGBT as illustrated in FIG. 4. In other words, the semiconductor device 1 can be used as an IGBT.

In the first embodiment, as described above, if the embedded electrode 5 is at a negative potential, the depletion layer 11 is formed from the trench 3a to the neighboring trenches 3a, so that the channel 10 is turned off (in which the current flowing through the channel 10 is interrupted). If the embedded electrode 5 is at a positive potential, the depletion layer 11 is not formed in each region between the neighboring trenches 3a, so that the channel 10 is turned on (in which current flows through the channel 10). Thus, by applying a negative potential or a positive potential to the embedded electrode 5, the channel 10 between the neighboring trenches 3a can be controlled to be turned off or turned on. In other words, the semiconductor device 1 can have a switching function. Further, in the above-mentioned structure, in the turned-on state, the entire region of each region between the neighboring trenches 3a in which the depletion layer 11 is not formed can function as the channel 10. Therefore, compared with the conventional semiconductor device (MOSFET) in which a very thin inversion layer functions as a channel, resistance against the current flowing through the channel 10 can be reduced largely. Thus, compared with the conventional semiconductor device, on-resistance can be reduced largely.

In addition, in the first embodiment, the silicon substrate 2 and the semiconductor layer 3 constitute the PN diode. Therefore, when a forward direction voltage is applied to the PN diode constituted of the silicon substrate 2 and the semiconductor layer 3, the PN diode can be controlled not to permit or to permit the current to flow by the above-mentioned switching function. Thus, regardless of potentials applied to the silicon substrate 2 (electrode layer 7) and the semiconductor layer 3 (electrode layer 6), on and off of the PN diode can be controlled by applying a positive potential or a negative potential to the embedded electrode 5. As a result, it is not necessary to dispose an additional switching mechanism for controlling on and off of the PN diode and to connect the semiconductor device 1 to the switching mechanism. Therefore, an increase in size of the entire device can be suppressed.

In addition, in the first embodiment, there are provided the $P^+$ type silicon substrate 2 and the N type semiconductor layer 3 disposed on the silicon substrate 2, so that a PNPN structure or an NPNP structure is not formed. Thus, it is possible to prevent a formation of a thyristor as a combination of a PNP transistor and an NPN transistor like an IGBT. Thus, it is possible to prevent occurrence of latch-up so that the semiconductor device can be used as an IGBT that permits more current to flow.

In addition, in the first embodiment, the $N^+$ layer 3d is formed on the entire surface of the N layer 3c, and only the $N^+$ layer 3d out of the N layer 3c and the $N^+$ layer 3d is made to contact with the electrode layer 6, so that a pitch of the trenches 3a (approximately 0.4 to 2 μm) can be small compared with the conventional semiconductor device. Thus, the number of channels 10 in a predetermined region can be increased and the area of the channel 10 can be increased, so that on-resistance can be reduced more.

In addition, in the first embodiment, if the embedded electrode 5 is at a negative potential, the depletion layer 11 is formed around each of the plurality of trenches 3a, and the depletion layers 11 are connected to each other so as to block each region between the neighboring trenches 3a. Thus, when the embedded electrode 5 is at a negative potential, the depletion layer 11 can easily be formed from the trench 3a to the neighboring trenches 3a. Thus, by setting the embedded electrode 5 to a negative potential, the channel 10 can easily be turned off (in which the current flowing through the channel 10 is interrupted).

In addition, in the first embodiment, by forming the trench 3a in the semiconductor layer 3 so as not to reach the silicon substrate 2, it is possible to prevent the depth of the trench 3a from being too large. Therefore, the trench 3a can easily be formed in the semiconductor layer 3.

In addition, in the first embodiment, the $N^+$ layer 3d having impurity concentration higher than that of the N layer 3b and the N layer 3c of the semiconductor layer 3 is formed on the electrode layer 6 side (upper side) of the semiconductor layer 3, so that the semiconductor layer 3 ($N^+$ layer 3d) can easily have an ohmic contact with the electrode layer 6. Thus, on-resistance can easily be reduced more.

Second Embodiment

Figure 5:
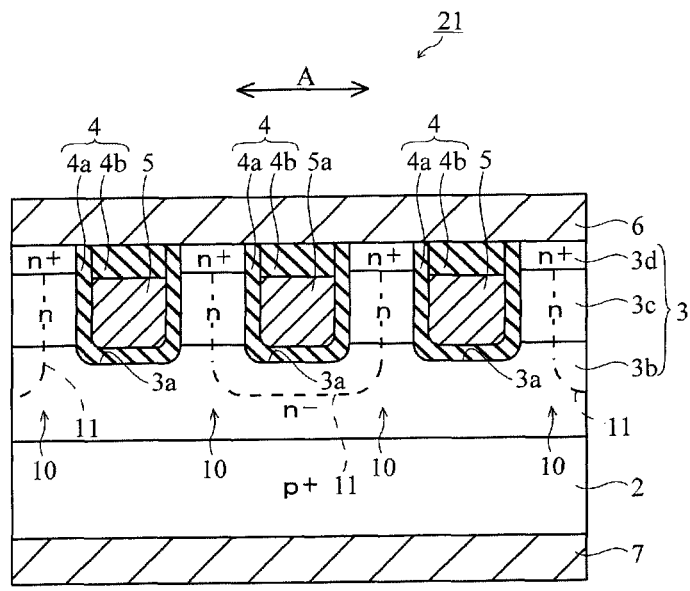
FIG. 5 is a cross sectional view illustrating a structure of a semiconductor device according to a second embodiment of the present invention.
Figure 6:
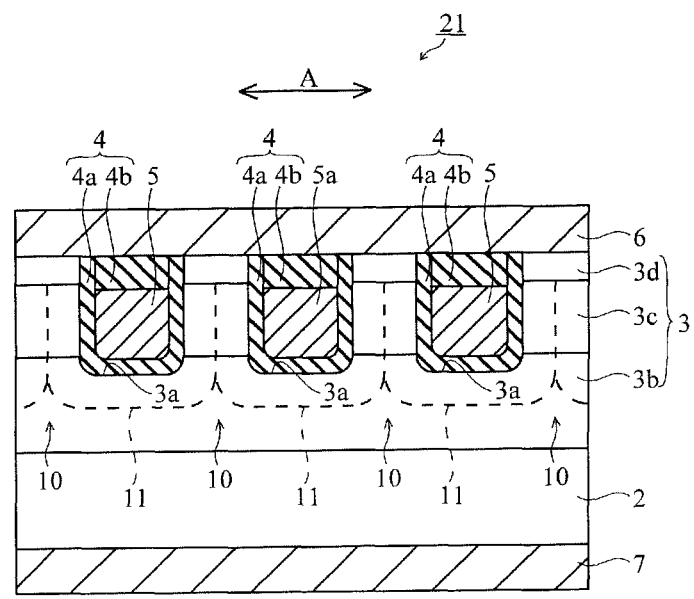
FIG. 6 is a cross sectional view illustrating a manner in which channels are interrupted in the semiconductor device according to the second embodiment illustrated in FIG. 5.

With reference to FIGS. 5 and 6, a second embodiment will describe a case different from the first embodiment, in which the embedded electrode 5 and the embedded electrode 5a to which a voltage is applied separately from the embedded electrode 5 are buried in the plurality of trenches 3a.

In a semiconductor device 21 according to the second embodiment of the present invention, as illustrated in FIG. 5, the embedded electrodes 5 and 5a are buried in the plurality of trenches 3a in an alternate manner. The embedded electrodes 5 and 5a are adapted to be applied with voltages separately to each other. Note that the embedded electrode 5 is an example of the "first embedded electrode" in the present invention, and the embedded electrode 5a is an example of the "second embedded electrode" in the present invention.

In addition, in the second embodiment, when a negative potential is applied to the embedded electrodes 5 and 5a, as illustrated in FIG. 6, the depletion layer 11 having decreased majority carrier (electrons) is formed around every trench 3a (embedded electrodes 5 and 5a). The neighboring depletion layers 11 are connected and overlapped with each other so as to block each region between the neighboring trenches 3a (embedded electrodes 5 and 5a), so that the depletion layer 11 is formed from the trench 3a (embedded electrodes 5 and 5a) to the neighboring trenches 3a (embedded electrodes 5 and 5a). In this case, the channel 10 between the neighboring trenches 3a (embedded electrodes 5 and 5a) is blocked with the depletion layer 11 so as to turned off (in which the current flowing through the channel 10 is interrupted). Therefore, current does not flow between the electrode layer 6 and the electrode layer 7 also when a negative potential is applied to the electrode layer 6 ($N^+$ layer 3d of the semiconductor layer 3) and a positive potential is applied to the electrode layer 7 (silicon substrate 2), i.e., when a forward direction voltage is applied to the PN diode. In other words, current does not flow in the PN diode.

In addition, in the second embodiment, when a positive potential is applied to the embedded electrode 5 and a negative potential is applied to the embedded electrode 5a, as illustrated in FIG. 5, the depletion layer 11 is not formed around the trench 3a buried with the embedded electrode 5. In contrast, the depletion layer 11 is formed around the trench 3a buried with the embedded electrode 5a. In this case, in the second embodiment, the region without the depletion layer 11 is formed in the region between the neighboring trenches 3a (embedded electrodes 5 and 5a). The channel 10 is turned on (in which current flows through the channel 10). Therefore, current flows between the electrode layer 6 and the electrode layer 7 when a negative potential is applied to the electrode layer 6 ($N^+$ layer 3d of the semiconductor layer 3) and a positive potential is applied to the electrode layer 7 (silicon substrate 2), i.e., when a forward direction voltage is applied to the PN diode. In other words, current flows in the PN diode.

Note that other structure of the second embodiment is the same as the first embodiment.

In addition, the effect of the second embodiment is the same as that of the first embodiment.

Third Embodiment

Figure 7:
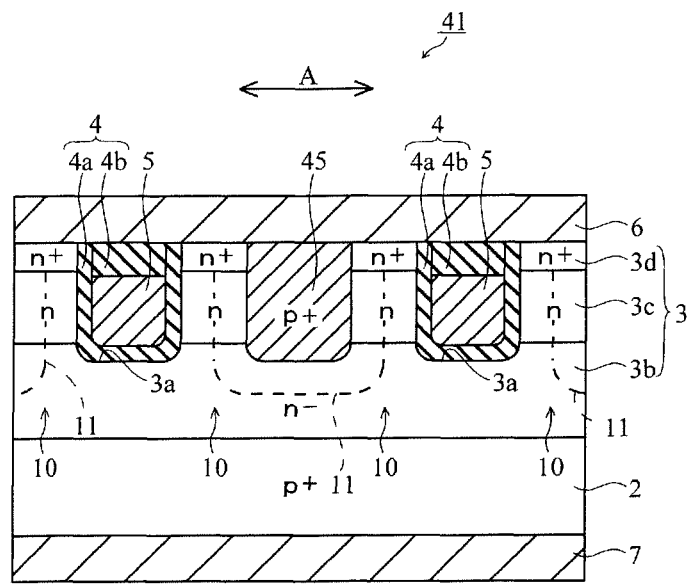
FIG. 7 is a cross sectional view illustrating a structure of a semiconductor device according to a third embodiment of the present invention.
Figure 8:
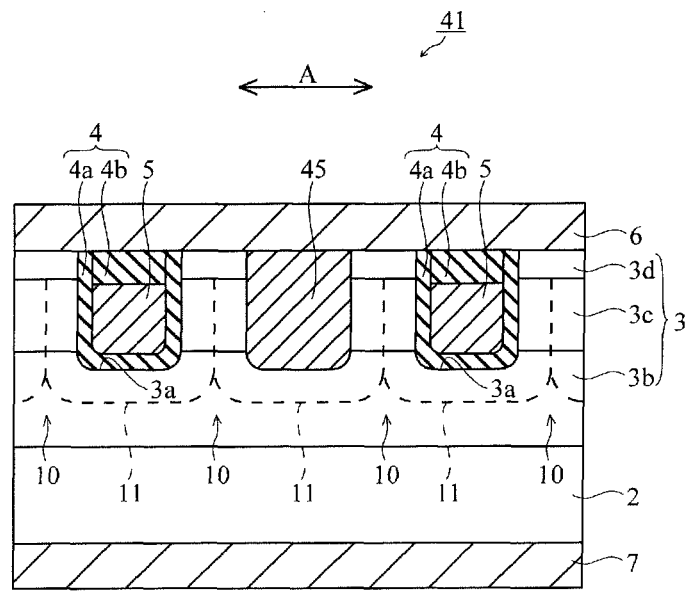
FIG. 8 is a cross sectional view illustrating a manner in which channels are interrupted in the semiconductor device according to the third embodiment illustrated in FIG. 7.

With reference to FIGS. 7 and 8, a third embodiment will describe a case different from the first embodiment, in which a $P^+$ type diffusion layer 45 is formed between the neighboring trenches 3a.

As illustrated in FIG. 7, in a semiconductor device 41 according to the third embodiment of the present invention, the semiconductor layer 3 further includes, in addition to the plurality of trenches 3a, a $P^+$ type diffusion layer 45 in which P type impurity is doped at high concentration. The $P^+$ type diffusion layer 45 is disposed in each region between the neighboring trenches 3a with a predetermined space to the trench 3a. In addition, the depletion layer 11 is formed around the $P^+$ type diffusion layer 45 regardless of potentials applied to the electrode layers 6 and 7 and the embedded electrode 5. In addition, the $P^+$ type diffusion layer 45 has an ohmic contact with the electrode layer 6. Note that the $P^+$ type diffusion layer 45 is an example of the "diffusion layer" in the present invention.

In addition, in the third embodiment, when a negative potential is applied to the embedded electrode 5, as illustrated in FIG. 8, the depletion layer 11 having decreased majority carrier (electrons) is formed around the every trench 3a (embedded electrode 5). In this case, the depletion layer 11 is formed also around the $P^+$ type diffusion layer 45. Thus, the neighboring depletion layers 11 are connected and overlapped with each other so as to block each region between the neighboring trenches 3a (embedded electrodes 5), so that the depletion layer 11 is formed from the trench 3a (embedded electrode 5) to the neighboring trenches 3a (embedded electrodes 5). In this case, the channel 10 between the neighboring trenches 3a (embedded electrodes 5) is blocked with the depletion layers 11 so as to be turned off (in which the current flowing through the channel 10 is interrupted). Therefore, current does not flow between the electrode layer 6 and the electrode layer 7 also when a negative potential is applied to the electrode layer 6 ($N^+$ layer 3d of the semiconductor layer 3) and a positive potential is applied to the electrode layer 7 (silicon substrate 2), i.e., when a forward direction voltage is applied to the PN diode. In other words, current does not flow in the PN diode.

In addition, in the third embodiment, when a positive potential is applied to the embedded electrode 5, as illustrated in FIG. 7, the depletion layer 11 is not formed around the trench 3a buried with the embedded electrode 5. In contrast, the depletion layer 11 is formed around the $P^+$ type diffusion layer 45. In this case, in the third embodiment, the region without the depletion layer 11 is formed in the region between the neighboring trenches 3a (embedded electrodes 5) so that the channel 10 is turned on (in which current flows through the channel 10). Therefore, current flows between the electrode layer 6 and the electrode layer 7 when a negative potential is applied to the electrode layer 6 ($N^+$ layer 3d of the semiconductor layer 3) and a positive potential is applied to the electrode layer 7 (silicon substrate 2), i.e., when a forward direction voltage is applied to the PN diode. In other words, current flows in the PN diode.

Note that other structure of the third embodiment is the same as the first embodiment.

In addition, the effect of the third embodiment is the same as that of the first embodiment.

Fourth Embodiment

Figure 9:
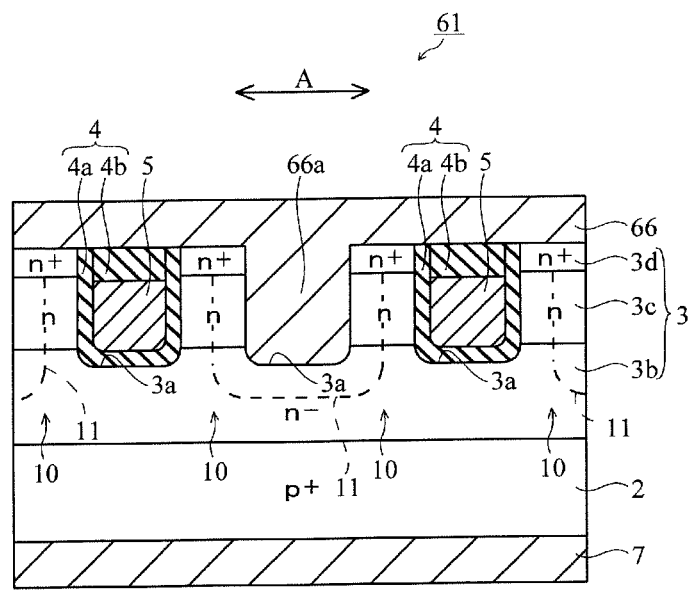
FIG. 9 is a cross sectional view illustrating a structure of a semiconductor device according to a fourth embodiment of the present invention.
Figure 10:
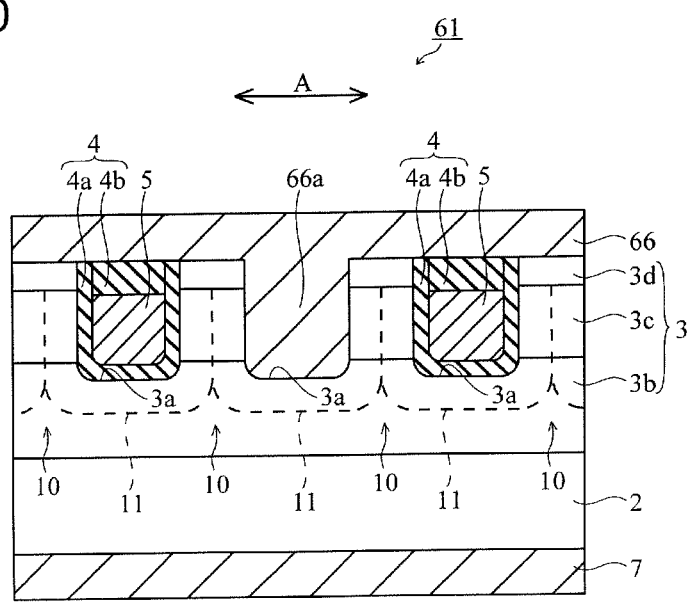
FIG. 10 is a cross sectional view illustrating a manner in which channels are interrupted in the semiconductor device according to the fourth embodiment illustrated in FIG. 9.

With reference to FIGS. 9 and 10, a fourth embodiment will describe a case different from the first embodiment, in which the embedded electrode 5 and a part of an electrode layer 66 are buried in the plurality of trenches 3a.

In a semiconductor device 61 according to the fourth embodiment of the present invention, as illustrated in FIG. 9, an embedded portion 66a of the electrode layer 66 disposed on the upper surface of the semiconductor layer 3 is disposed in the trench 3a that is a part of the plurality of trenches 3a. The embedded portions 66a and the embedded electrodes 5 are buried in the plurality of trenches 3a alternately. In addition, the embedded portion 66a has a Schottky contact with the semiconductor layer 3 in the trench 3a. Note that the electrode layer 66 is an example of the "wiring layer" in the present invention. In addition, the embedded electrode 5 is an example of the "first embedded electrode" in the present invention, and the embedded portion 66a is an example of the "second embedded electrode" in the present invention.

In addition, the insulator film 4 is not disposed in the trench 3a buried with the embedded portion 66a.

In addition, in the fourth embodiment, when a negative potential is applied to the embedded electrode 5 and a negative potential is applied to the electrode layer 66 (embedded portion 66a), as illustrated in FIG. 10, the depletion layer 11 having decreased majority carrier (electrons) is formed around every trench 3a (the embedded electrode 5 and the embedded portion 66a). In this case, the neighboring depletion layers 11 are connected and overlapped with each other so as to block each region between the neighboring trenches 3a, so that the depletion layer 11 is formed from the trench 3a to the neighboring trenches 3a. In this case, the channel 10 between the neighboring trenches 3a is blocked with the depletion layer 11 so as to be turned off (in which the current flowing through the channel 10 is interrupted). Therefore, current does not flow between the electrode layer 66 and the electrode layer 7 also when a negative potential is applied to the electrode layer 66 ($N^+$ layer 3d of the semiconductor layer 3) and a positive potential is applied to the electrode layer 7 (silicon substrate 2), i.e., when a forward direction voltage is applied to the PN diode. In other words, current does not flow in the PN diode.

In addition, in the fourth embodiment, when a positive potential is applied to the embedded electrode 5 and a negative potential is applied to the electrode layer 66 (embedded portion 66a), as illustrated in FIG. 9, the depletion layer 11 is not formed around the trench 3a buried with the embedded electrode 5. In contrast, the depletion layer 11 is formed around the trench 3a buried with the embedded portion 66a. In this case, in the fourth embodiment, the region without the depletion layer 11 is formed in the region between the neighboring trenches 3a so that the channel 10 is turned on (in which current flows through the channel 10). Therefore, when a negative potential is applied to the electrode layer 66 ($N^+$ layer 3d of the semiconductor layer 3) and a positive potential is applied to the electrode layer 7 (silicon substrate 2), i.e., when a forward direction voltage is applied to the PN diode, current flows between the electrode layer 66 and the electrode layer 7. In other words, current flows in the PN diode.

Note that other structure of the fourth embodiment is the same as the first embodiment.

In addition, the effect of the fourth embodiment is the same as that of the first embodiment.

Fifth Embodiment

With reference to FIGS. 11 to 14, a structure of a semiconductor device 101 according to a fifth embodiment of the present invention will be described.

Figure 11:
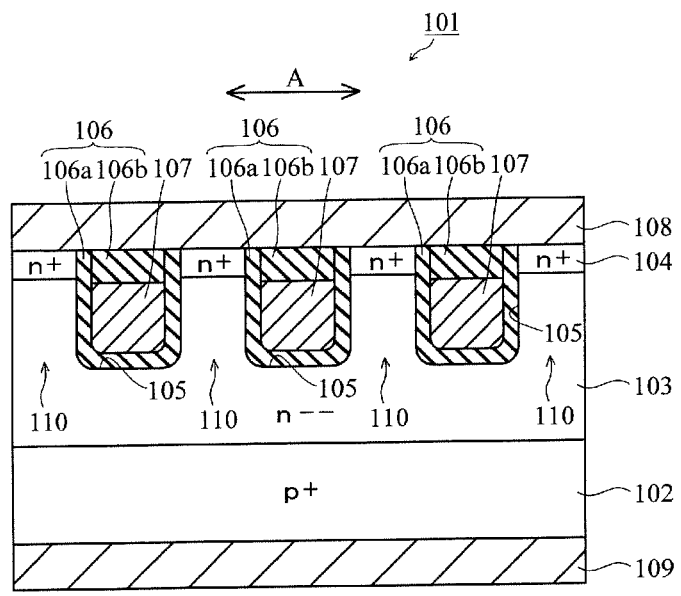
FIG. 11 is a cross sectional view illustrating a structure of a semiconductor device according to a fifth embodiment of the present invention.

As illustrated in FIG. 11, the semiconductor device 101 according to the fifth embodiment of the present invention includes a silicon substrate 102 made of $P^+$ type semiconductor, a semiconductor layer 103 made of n− type silicon disposed on an upper surface (principal surface) of the silicon substrate 102, a semiconductor layer 104 made of $N^+$ type silicon disposed on the semiconductor layer 103, a plurality of embedded electrodes 107 disposed via an insulator film 106 on the inner surface of each of the plurality of trenches 105 formed in the semiconductor layers 103 and 104, an electrode layer 108 made of a metal layer disposed on the upper surfaces of the semiconductor layer 104 and the insulator film 106 (embedded electrode 107), and an electrode layer 109 made of a metal layer disposed on a lower surface of the silicon substrate 102. Note that the silicon substrate 102 is an example of the "third semiconductor layer" in the present invention, and the semiconductor layer 103 is an example of the "fourth semiconductor layer" in the present invention. In addition, the semiconductor layer 104 is an example of the "fifth semiconductor layer" in the present invention, and the electrode layer 108 is an example of the "wiring layer" in the present invention. In addition, the $P^+$ type (P type) is an example of the "third conductivity type" in the present invention, and the $N^+$ type (N type) is an example of the "fourth conductivity type" in the present invention. In addition, the n− type silicon is an example of the "intrinsic semiconductor" in the present invention.

Here, in the fifth embodiment, the $P^+$ type silicon substrate 102, the n− type semiconductor layer 103 and the $N^+$ type semiconductor layer 104 form a PIN junction, so that the silicon substrate 102 and the semiconductor layers 103 and 104 constitute a PIN diode.

P type impurity such as boron (B) is doped at high concentration in the silicon substrate 102 so that the doze amount becomes approximately $1\times10^{17}$ to $1\times10^{20}$ cm$^{-3}$. Thus, the lower surface of the silicon substrate 102 has an ohmic contact with the electrode layer 109.

The semiconductor layer 103 has a thickness of approximately 1 to 10 μm. In addition, each region between the neighboring trenches 105 in the semiconductor layer 103 functions as a channel 110. In addition, the semiconductor layer 103 has impurity concentration that is sufficiently lower than that in the silicon substrate 102 and the semiconductor layer 104. Specifically, N type impurity such as phosphorus (P) is doped in the semiconductor layer 103 so that the doze amount becomes approximately $1\times10^{13}$ to $1\times10^{17}$ cm$^{-3}$.

In addition, in the fifth embodiment, the semiconductor layer 104 is disposed on the semiconductor layer 103, only the semiconductor layer 104 out of the semiconductor layers 103 and 104 contacts with the electrode layer 108. In addition, the semiconductor layer 104 is constituted of a high concentration impurity region having impurity concentration higher than that in the semiconductor layer 103. Thus, the semiconductor layer 104 has an ohmic contact with the electrode layer 108. Specifically, N type impurity such as phosphorus (P) is doped in the semiconductor layer 104 so that the doze amount becomes approximately $1\times10^{19}$ to $1\times10^{20}$ cm$^{-3}$.

In addition, in the fifth embodiment, a plurality of trenches 105 are formed at a pitch of approximately 0.4 to 2 μm in the A-direction. In addition, the plurality of trenches 105 are arranged with spaces of approximately 0.05 to 1 μm in the A-direction. In addition, the trench 105 is formed so as to have a depth of approximately 1 μm and to reach the semiconductor layer 103 from the upper surface of the semiconductor layer 104. In other words, the trench 105 is formed in the semiconductor layers 103 and 104 so as not to reach the silicon substrate 102. Note that the trench 105 may be formed so as to penetrate the semiconductor layer 103 and to reach the silicon substrate 102.

The insulator film 106 is made of $SiO_2$ or the like. In addition, the insulator film 106 includes a silicon oxide film 106a disposed so as to cover the inner surface of the trench 105 and an interlayer insulator film 106b buried in the trench 105 to a vicinity of the upper end portion so as to cover the embedded electrode 107. The silicon oxide film 106a is formed by a thermal process of the semiconductor layers 103 and 104 so as to have a thickness of approximately 10 to 100 nm. In addition, the interlayer insulator film 106b has a thickness that is substantially the same as or larger than that of the semiconductor layer 104.

The embedded electrode 107 is made of polysilicon.

The electrode layer 108 is made of Al or the like so as to have an ohmic contact with the semiconductor layer 104.

The electrode layer 109 is made of a metal multilayered film so as to have an ohmic contact with the silicon substrate 102.

Figure 12:
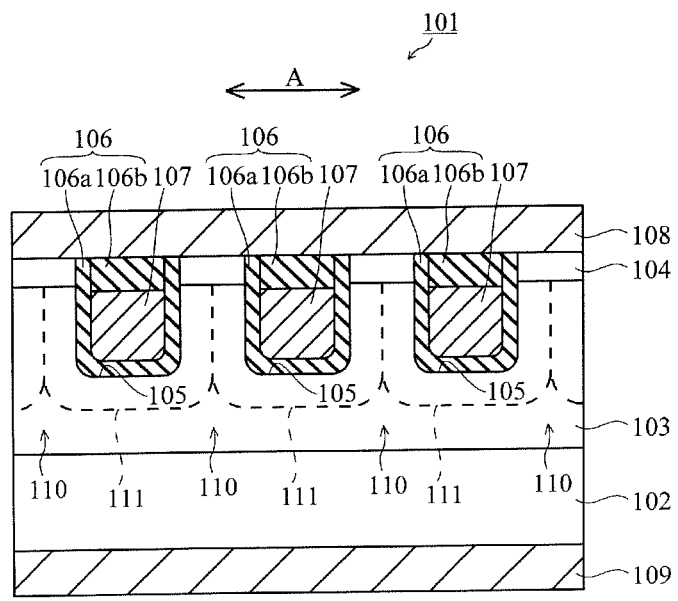
FIG. 12 is a cross sectional view illustrating a manner in which depletion layers are formed in a semiconductor layer of the semiconductor device according to the fifth embodiment illustrated in FIG. 11.

Here, in the fifth embodiment, when a negative potential is applied to the embedded electrode 107, as illustrated in FIG. 12, a depletion layer 111 with decreased majority carrier (electrons) is formed around the every trench 105 (embedded electrode 107). The neighboring depletion layers 111 are connected and overlapped with each other so as to block each region between the neighboring trenches 105 (embedded electrodes 107), so that the depletion layers 111 is formed from the trench 105 (embedded electrode 107) to the neighboring trenches 105 (embedded electrodes 107). In this case, the channel 110 between the neighboring trenches 105 (embedded electrodes 107) is blocked with the depletion layers 111 so as to be turned off (in which the current flowing through the channel 110 is interrupted). Therefore, current does not flow between the electrode layer 108 and the electrode layer 109 also when a negative potential is applied to the electrode layer 108 (semiconductor layer 104) and a positive potential is applied to the electrode layer 109 (silicon substrate 102), i.e., when a forward direction voltage is applied to the PIN diode. In other words, current does not flow in the PIN diode.

In addition, in the fifth embodiment, when a positive potential is applied to the embedded electrode 107, as illustrated in FIG. 11, the depletion layer 111 (see FIG. 12) is not formed around the trench 105 (embedded electrode 107). In other words, the depletion layer 111 formed around the trench 105 is deleted. In this case, in the fifth embodiment, the channel 110 is turned on (in which current flows through the channel 110) in every region between the neighboring trenches 105 (embedded electrodes 107). Therefore, when a negative potential is applied to the electrode layer 108 (semiconductor layer 104) and a positive potential is applied to the electrode layer 109 (silicon substrate 102), i.e., when a forward direction voltage is applied to the PIN diode, current flows between the electrode layer 108 and the electrode layer 109. In other words, current flows in the PIN diode.

In this way, in the fifth embodiment, a formation state of the depletion layer 111 formed around the trench 105 (embedded electrode 107) changes in accordance with the applied voltage (potential) to the embedded electrode 107.

Figure 13:
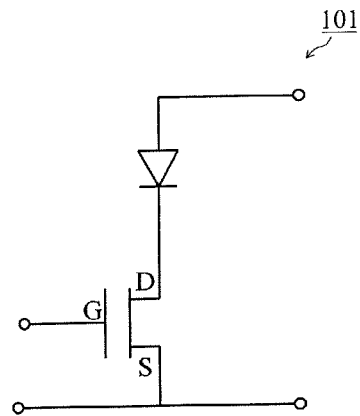
FIG. 13 is a diagram illustrating an equivalent circuit of the semiconductor device according to the fifth embodiment illustrated in FIG. 11.

In the fifth embodiment, it is supposed that the semiconductor layer 103 side is a drain (D), the semiconductor layer 104 (electrode layer 108) is a source (S), and the embedded electrode 107 is a gate (G). Then, as illustrated in FIG. 13, the semiconductor device 101 can be regarded to have a circuit in which a switching mechanism (transistor constituted of the semiconductor layers 103 and 4 and the embedded electrode 107) is connected to the PIN diode. In other words, the semiconductor device 101 can be used as a PIN diode having a switching function.

Figure 14:
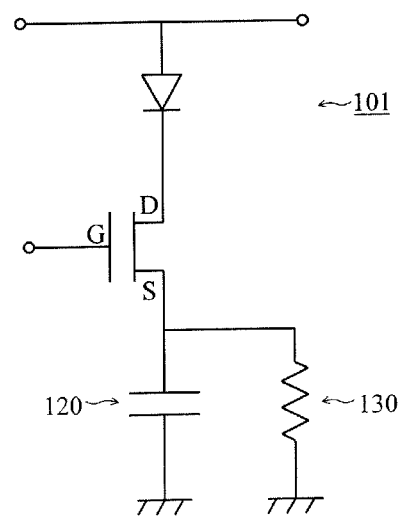
FIG. 14 is a diagram illustrating a high frequency interrupt circuit that can control on and off using the semiconductor device of the fifth embodiment illustrated in FIG. 11.

As illustrated in FIG. 14, by connecting the semiconductor device 101 to a smoothing circuit in which a capacitor 120 and a resistor 130 are connected in parallel, the semiconductor device 101 can be used as a high frequency interrupt circuit that can control on and off.

In the fifth embodiment, as described above, if the embedded electrode 107 is at a negative potential, the depletion layer 111 is formed from the trench 105 to the neighboring trenches 105, so that the channel 110 is turned off (in which the current flowing through the channel 110 is interrupted). In contrast, if the embedded electrode 107 is at a positive potential, the depletion layer 111 is not formed in each region between the neighboring trenches 105, so that the channel 110 is turned on (in which current flows through the channel 110). Thus, by applying a negative potential or a positive potential to the embedded electrode 107, the channel 110 between the neighboring trenches 105 can be controlled to be turned off or to be turned on. In other words, the semiconductor device 101 can have a switching function. Further, in the above-mentioned structure, in the turned-on state, the entire region of each region between the neighboring trenches 105 in which the depletion layer 111 is not formed can function as the channel 110. Therefore, compared with the conventional semiconductor device (MOSFET) in which a very thin inversion layer functions as a channel, resistance against current flowing through the channel 110 can be reduced largely. Thus, compared with the conventional semiconductor device, on-resistance can be reduced largely.

In addition, in the fifth embodiment, the silicon substrate 102, the semiconductor layer 103 and the semiconductor layer 104 constitute the PIN diode. Thus, when a forward direction voltage is applied to the PIN diode constituted of the silicon substrate 102, the semiconductor layer 103 and the semiconductor layer 104, the PIN diode can be controlled so as not to permit or to permit the current to flow by the above-mentioned switching function. Thus, regardless of potentials applied to the silicon substrate 102 (electrode layer 109) and the semiconductor layer 104 (electrode layer 108), on and off of the PIN diode can be controlled by applying a positive potential or a negative potential to the embedded electrode 107. As a result, it is not necessary to provide another switching mechanism for controlling on and off of the PIN diode and to connect the semiconductor device 101 to the switching mechanism, so that an increase in size of the entire device can be suppressed.

In addition, in the fifth embodiment, the semiconductor layer 104 is formed on the semiconductor layer 103, and only the semiconductor layer 104 out of the semiconductor layer 103 and the semiconductor layer 104 is made to contact with the electrode layer 108. Thus, compared with the conventional semiconductor device, the pitch of the trenches 105 (approximately 0.8 μm) can be reduced. Thus, the number of channels 110 in a predetermined region can be increased, and the area of the channel 110 can be increased, so that on-resistance can be reduced more.

In addition, in the fifth embodiment, when the embedded electrode 107 is at a negative potential, the depletion layer 111 is formed around each of the plurality of trenches 105, and the depletion layers 111 are connected to each other so as to block each region between the neighboring trenches 105. Thus, when the embedded electrode 107 is at a negative potential, the depletion layer 111 can easily be formed from the trench 105 to the neighboring trenches 105. Thus, by setting the embedded electrode 107 to a negative potential, the channel 110 can easily be turned off (in which the current flowing through the channel 110 is interrupted).

In addition, in the fifth embodiment, it is possible to prevent the depth of the trench 105 from being too large by forming the trench 105 in the semiconductor layer 103 so as not to reach the silicon substrate 102. Thus, the trench 105 can easily be formed in the semiconductor layer 103.

In addition, in the fifth embodiment, the semiconductor layer 104 is constituted of a high concentration impurity region having impurity concentration higher than that in the semiconductor layer 103, so that the semiconductor layer 104 can easily have an ohmic contact with the electrode layer 108. Thus, on-resistance can easily be reduced more.

Sixth Embodiment

Figure 15:
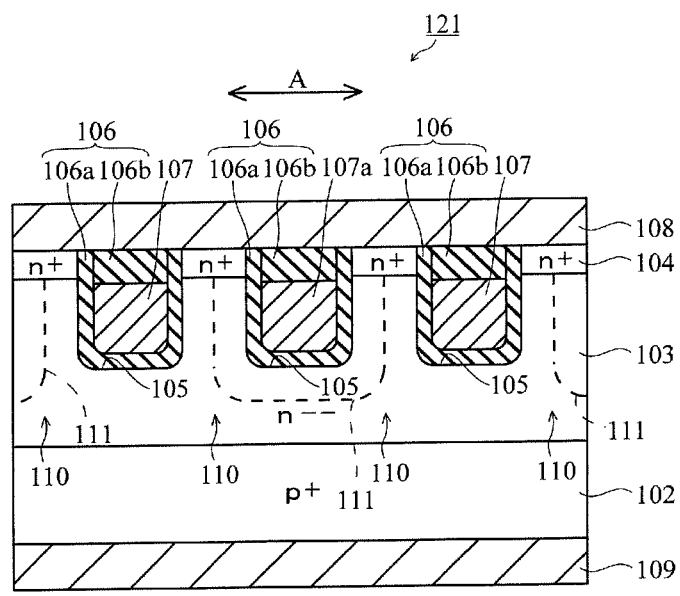
FIG. 15 is a cross sectional view illustrating a structure of a semiconductor device according to a sixth embodiment of the present invention.
Figure 16:
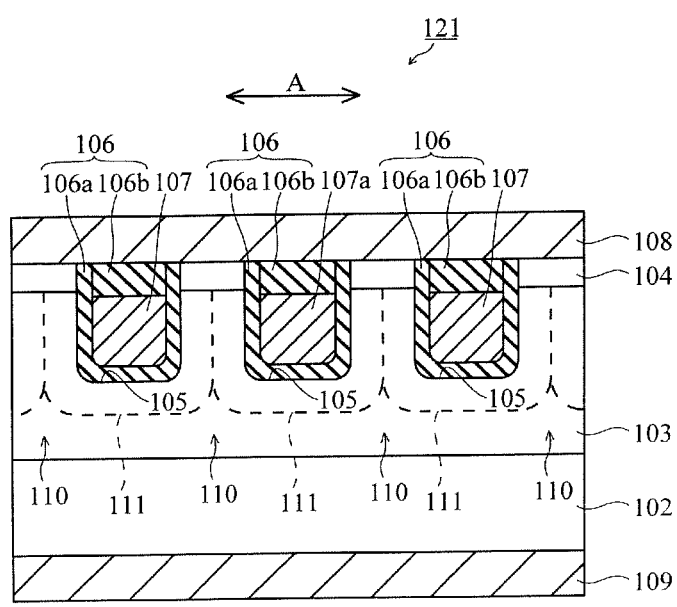
FIG. 16 is a cross sectional view illustrating a manner in which channels are interrupted in the semiconductor device according to the sixth embodiment illustrated in FIG. 15.

With reference to FIGS. 15 and 16, a sixth embodiment will describe a case different from the fifth embodiment, in which the embedded electrode 107 and an embedded electrode 107a to which a voltage is applied separately to the embedded electrode 107 are buried in the plurality of trenches 105.

As illustrated in FIG. 15, a semiconductor device 121 according to the sixth embodiment of the present invention includes embedded electrodes 107 and 107a that are buried in the plurality of trenches 105 alternately. The embedded electrodes 107 and 107a are adapted to be applied with voltages separately from each other. Note that the embedded electrode 107 is an example of the "third embedded electrode" in the present invention, and the embedded electrode 107a is an example of the "fourth embedded electrode" in the present invention.

In addition, in the sixth embodiment, when a negative potential is applied to the embedded electrodes 107 and 107a, the depletion layer 111 with decreased majority carrier (electrons) is formed around every trench 105 (embedded electrodes 107 and 107a) as illustrated in FIG. 16. The neighboring depletion layers 111 are connected and overlapped with each other so as to block each region between the neighboring trenches 105 (embedded electrodes 107 and 107a), so that the depletion layer 111 is formed from the trench 105 (embedded electrodes 107 and 107a) to the neighboring trenches 105 (embedded electrodes 107 and 107a). In this case, the channel 110 between the neighboring trenches 105 (embedded electrodes 107 and 107a) is blocked with the depletion layer 111 so as to be turned off (in which the current flowing through the channel 110 is interrupted). Therefore, current does not flow between the electrode layer 108 and the electrode layer 109 also when a negative potential is applied to the electrode layer 108 (semiconductor layer 104) and a positive potential is applied to the electrode layer 109 (silicon substrate 102), i.e., when a forward direction voltage is applied to the PIN diode. In other words, current does not flow in the PIN diode.

In addition, in the sixth embodiment, when a positive potential is applied to the embedded electrode 107 and a negative potential is applied to the embedded electrode 107a, as illustrated in FIG. 15, the depletion layer 111 is not formed around the trench 105 buried with the embedded electrode 107. In contrast, the depletion layer 111 is formed around the trench 105 buried with the embedded electrode 107a. In this case, in the sixth embodiment, the region without the depletion layer 111 is formed in the region between the neighboring trenches 105 (embedded electrodes 107 and 107a), so that the channel 110 is turned on (in which current can flow through the channel 110). Therefore, when a negative potential is applied to the electrode layer 108 (semiconductor layer 104) and a positive potential is applied to the electrode layer 109 (silicon substrate 102), i.e., when a forward direction voltage is applied to the PIN diode, current flows between the electrode layer 108 and the electrode layer 109. In other words, current flows in the PIN diode.

Note that other structure of the sixth embodiment is the same as that of the fifth embodiment.

In addition, the effect of the sixth embodiment is the same as that of the fifth embodiment.

Seventh Embodiment

Figure 17:
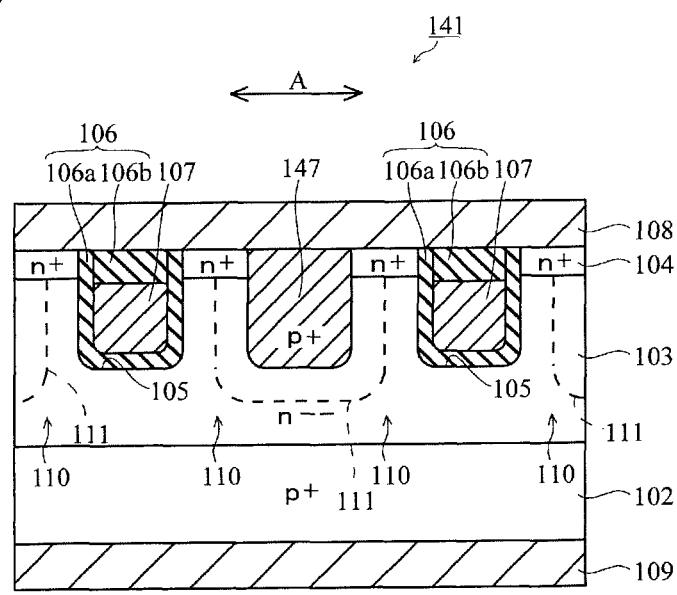
FIG. 17 is a cross sectional view illustrating a structure of a semiconductor device according to a seventh embodiment of the present invention.
Figure 18:
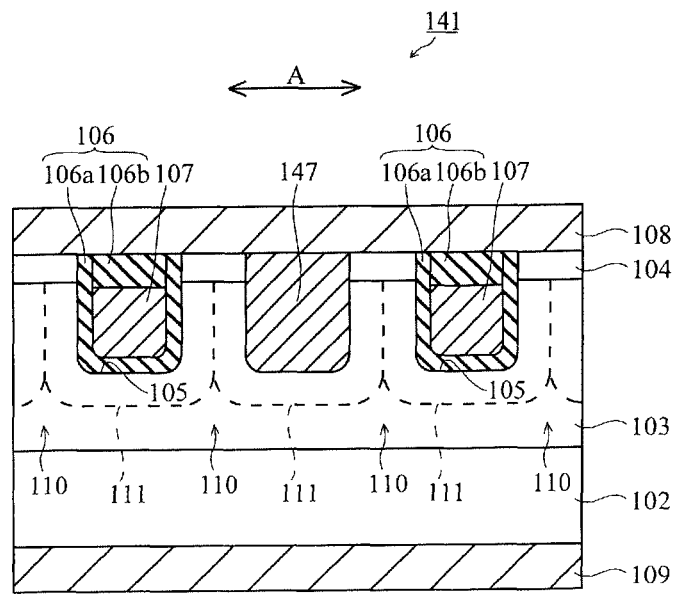
FIG. 18 is a cross sectional view illustrating a manner in which channels are interrupted in the semiconductor device according to the seventh embodiment illustrated in FIG. 17.

With reference to FIGS. 17 and 18, a seventh embodiment will describe a case different from the fifth embodiment, in which a P⁺ type diffusion layer 147 is formed between the neighboring trenches 105.

As illustrated in FIG. 17, in a semiconductor device 141 of the seventh embodiment of the present invention, the semiconductor layer 103 further includes, in addition to the plurality of trenches 105, the P⁺ type diffusion layer 147 in which P type impurity is doped at high concentration. The P⁺ type diffusion layer 147 is disposed in each region between the neighboring trenches 105 with a predetermined space to the trench 105. In addition, the depletion layer 111 is formed around the P⁺ type diffusion layer 147 regardless of potentials to be applied to the electrode layers 108 and 109 and the embedded electrode 107. In addition, the P⁺ type diffusion layer 147 has an ohmic contact with the electrode layer 108. Note that the P⁺ type diffusion layer 147 is an example of the "diffusion layer" in the present invention.

In addition, in the seventh embodiment, when a negative potential is applied to the embedded electrode 107, the depletion layer 111 with decreased majority carrier (electrons) is formed around the every trench 105 (embedded electrode 107) as illustrated in FIG. 18. In this case, the depletion layer 111 is formed also around the P⁺ type diffusion layer 147. Thus, the neighboring depletion layers 111 are connected and overlapped with each other so as to block each region between the neighboring trenches 105 (embedded electrodes 107), so that the depletion layer 111 is formed from the trench 105 (embedded electrode 107) to the neighboring trenches 105 (embedded electrodes 107). In this case, the channel 110 between the neighboring trenches 105 (embedded electrodes 107) is blocked with the depletion layer 111 so as to be turned off (in which the current flowing through the channel 110 is interrupted). Therefore, current does not flow between the electrode layer 108 and the electrode layer 109 also when a negative potential is applied to the electrode layer 108 (semiconductor layer 104) and a positive potential is applied to the electrode layer 109 (silicon substrate 102), i.e., when a forward direction voltage is applied to the PIN diode. In other words, current does not flow in the PIN diode.

In addition, in the seventh embodiment, when a positive potential is applied to the embedded electrode 107, as illustrated in FIG. 17, the depletion layer 111 is not formed around the trench 105 buried with the embedded electrode 107. In contrast, the depletion layer 111 is formed around the P⁺ type diffusion layer 147. In this case, in the seventh embodiment, the region without the depletion layer 111 is formed in the region between the neighboring trenches 105 (embedded electrodes 107), so that the channel 110 is turned on (in which current flows through the channel 110). Therefore, current flows between the electrode layer 108 and the electrode layer 109 when a negative potential is applied to the electrode layer 108 (semiconductor layer 104) and a positive potential is applied to the electrode layer 109 (silicon substrate 102), i.e., when a forward direction voltage is applied to the PIN diode. In other words, current flows in the PIN diode.

Note that other structure of the seventh embodiment is the same as the fifth embodiment.

In addition, the effect of the seventh embodiment is the same as that of the fifth embodiment.

Eighth Embodiment

Figure 19:
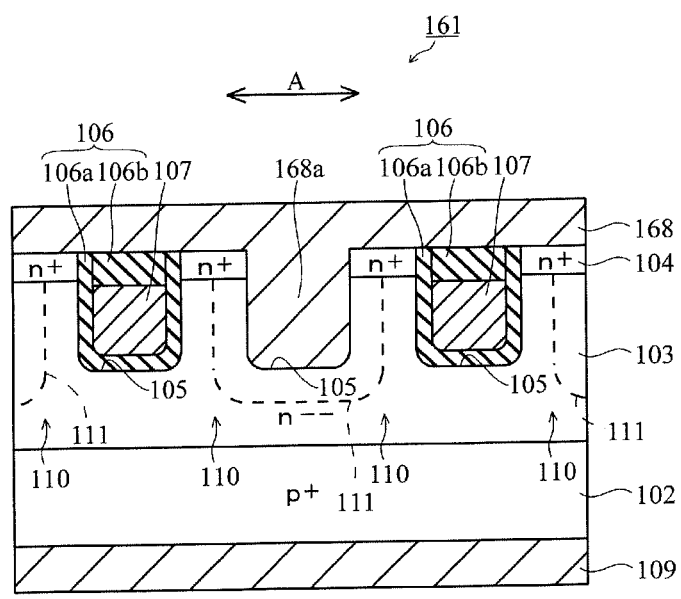
FIG. 19 is a cross sectional view illustrating a structure of a semiconductor device according to an eighth embodiment of the present invention.
Figure 20:
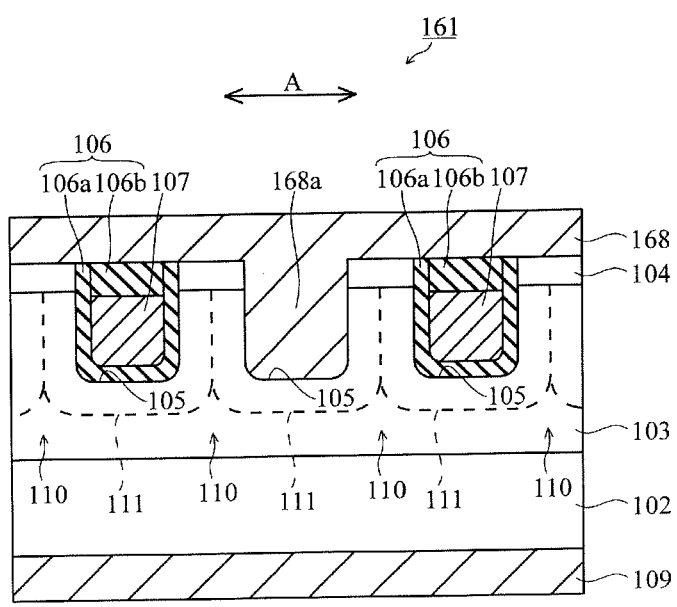
FIG. 20 is a cross sectional view illustrating a manner in which channels are interrupted in the semiconductor device according to the eighth embodiment illustrated in FIG. 19.

With reference to FIGS. 19 and 20, an eighth embodiment will describe a case different from the fifth embodiment, in which the embedded electrodes 107 and a part of an electrode layer 168 are buried in the plurality of trenches 105.

In a semiconductor device 161 according to the eighth embodiment of the present invention, as illustrated in FIG. 19, an embedded portion 168a of the electrode layer 168 disposed on the upper surface of the semiconductor layer 104 is disposed in the trench 105 that is a part of the plurality of trenches 105. The embedded portions 168a and the embedded electrode 107 are buried in the plurality of trenches 105 alternately. In addition, the embedded portion 168a has a Schottky contact with the semiconductor layer 103 inside the trench 105. Note that the electrode layer 168 is an example of the "wiring layer" in the present invention. In addition, the embedded electrode 107 is an example of the "third embedded electrode" in the present invention, and the embedded portion 168a is an example of the "fourth embedded electrode" in the present invention.

In addition, the insulator film 106 is not disposed in the trench 105 buried with the embedded portion 168a.

In addition, in the eighth embodiment, when a negative potential is applied to the embedded electrode 107 and a negative potential is applied to the electrode layer 168 (embedded portion 168a), as illustrated in FIG. 20, the depletion layer 111 with decreased majority carrier (electrons) is formed around every trench 105 (the embedded electrode 107 and the embedded portion 168a). In this case, the neighboring depletion layers 111 are connected and overlapped with each other so as to block each region between the neighboring trenches 105, so that the depletion layer 111 is formed from the trench 105 to the neighboring trenches 105. In this case, the channel 110 between the neighboring trenches 105 is blocked with the depletion layer 111 so as to be turned off (in which the current flowing through the channel 110 is interrupted). Therefore, current does not flow between the electrode layer 168 and the electrode layer 109 also when a negative potential is applied to the electrode layer 168 (semiconductor layer 104) and a positive potential is applied to the electrode layer 109 (silicon substrate 102), i.e., when a forward direction voltage is applied to the PIN diode. In other words, current does not flow in the PIN diode.

In addition, in the eighth embodiment, when a positive potential is applied to the embedded electrode 107 and a negative potential is applied to the electrode layer 168 (embedded portion 168a), as illustrated in FIG. 19, the depletion layer 111 is not formed around the trench 105 buried with the embedded electrode 107. In contrast, the depletion layer 111 is formed around the trench 105 buried with the embedded portion 168a. In this case, in the eighth embodiment, the region without the depletion layer 111 is formed in the region between the neighboring trenches 105. Therefore, the channel 110 is turned on (in which current flows through the channel 110). Therefore, when a negative potential is applied to the electrode layer 168 (semiconductor layer 104) and a positive potential is applied to the electrode layer 109 (silicon substrate 102), i.e., when a forward direction voltage is applied to the PIN diode, current flows between the electrode layer 168 and the electrode layer 109. In other words, current flows in the PIN diode.

Note that other structure of the eighth embodiment is the same as the fifth embodiment.

In addition, the effect of the eighth embodiment is the same as that of the fifth embodiment.

Ninth Embodiment

With reference to FIGS. 21 to 24, a structure of a semiconductor device 201 according to a ninth embodiment of the present invention will be described.

Figure 21:
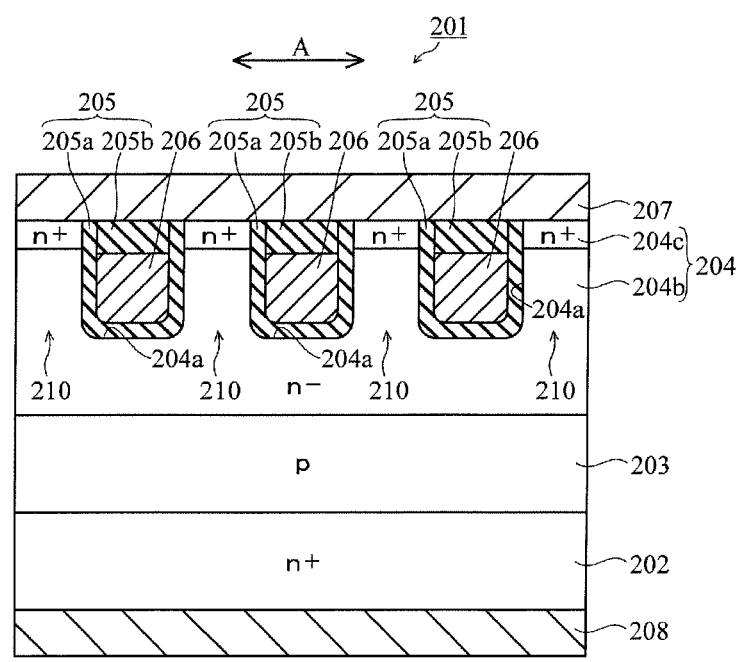
FIG. 21 is a cross sectional view illustrating a structure of a semiconductor device according to a ninth embodiment of the present invention.

As illustrated in FIG. 21, the semiconductor device 201 according to a ninth embodiment of the present invention includes a silicon substrate 202 made of $N^+$ type semiconductor, a semiconductor layer 203 made of P type silicon disposed on the upper surface (principal surface) of the silicon substrate 202, a semiconductor layer 204 made of N type silicon having a plurality of trenches 204a disposed on the semiconductor layer 203, a plurality of embedded electrodes 206 each of which is disposed via an insulator film 205 on an inner surface of each of the plurality of trenches 204a in the semiconductor layer 204, an electrode layer 207 made of a metal layer disposed on upper surfaces of the semiconductor layer 204 and the insulator film 205 (embedded electrode 206), and an electrode layer 208 made of a metal layer disposed on the lower surface of the silicon substrate 202. Note that the silicon substrate 202 is an example of the "sixth semiconductor layer" in the present invention, and the semiconductor layer 203 is an example of the "seventh semiconductor layer" in the present invention. In addition, the semiconductor layer 204 is an example of the "eighth semiconductor layer" in the present invention, and the electrode layer 207 is an example of the "wiring layer" in the present invention. In addition, the N type ($N^+$ type, $N^-$ type) is an example of the "fifth conductivity type" in the present invention, and the P type is an example of the "sixth conductivity type" in the present invention.

Here, in the ninth embodiment, the $N^+$ type silicon substrate 202, the P type semiconductor layer 203 and the N type semiconductor layer 204 constitute the bipolar transistor.

N type impurity such as phosphorus (P) is doped in the silicon substrate 202 at high concentration so that the doze amount becomes approximately $1 \times 10^{17}$ to $1 \times 10^{21}$ $cm^{-3}$. Thus, the lower surface of the silicon substrate 202 has an ohmic contact with the electrode layer 208.

The semiconductor layer 203 has a thickness of approximately 0.5 to 50 μm. In addition, P type impurity such as boron (B) is doped in the semiconductor layer 203 so that the doze amount becomes approximately $1 \times 10^{14}$ to $1 \times 10^{18}$ $cm^{-3}$.

The semiconductor layer 204 has a thickness of approximately 1 to 10 μm. In addition, each region between the neighboring trenches 204a in the semiconductor layer 204 functions as a channel 210. In addition, the semiconductor layer 204 includes an $N^-$ layer 204b and an $N^+$ layer 204c disposed on the $N^-$ layer 204b. Thus, in the semiconductor layer 204, only the $N^+$ layer 204c out of the $N^-$ layer 204b and the $N^+$ layer 204c contacts with the electrode layer 207.

In addition, in the ninth embodiment, the $N^+$ layer 204c has impurity concentration higher than that in the $N^-$ layer 204b. Thus, the $N^+$ layer 204c has an ohmic contact with the electrode layer 207. Specifically, N type impurity such as phosphorus (P) is doped in the $N^-$ layer 204b and the $N^+$ layer 204c so that the doze amounts become approximately $5 \times 10^{15}$ to $1 \times 10^{19}$ $cm^{-3}$ and approximately $1 \times 10^{19}$ to $1 \times 10^{20}$ $cm^{-3}$, respectively. Note that the $N^+$ layer 204c is an example of the "high concentration impurity region" in the present invention.

In addition, in the ninth embodiment, a plurality of trenches 204a in the semiconductor layer 204 are formed at a pitch of approximately 0.4 to 2 μm in the A-direction. In addition, the plurality of trenches 204a are arranged with spaces of approximately 0.05 to 0.5 μm in the A-direction. In addition, the trench 204a has a depth of approximately 1 μm and is formed so as to penetrate the $N^+$ layer 204c from the upper surface of the semiconductor layer 204 ($N^+$ layer 204c) and to reach the $N^-$ layer 204b. In other words, the trench 204a is formed in the semiconductor layer 204 so as not to reach the semiconductor layer 203. Note that the trench 204a may be formed so as to penetrate the semiconductor layer 204 and to reach the semiconductor layer 203.

The insulator film 205 is made of $SiO_2$ or the like. In addition, the insulator film 205 includes a silicon oxide film 205a disposed so as to cover the inner surface of the trench 204a, and an interlayer insulator film 205b buried in the trench 204a to a vicinity of the upper end portion so as to cover the embedded electrode 206. The silicon oxide film 205a is formed by a thermal process of the semiconductor layer 204 so as to have a thickness of approximately 10 to 100 nm. In addition, the interlayer insulator film 205b has a thickness that is substantially the same as or larger than that of the $N^+$ layer 204c in the semiconductor layer 204.

The embedded electrode 206 is made of polysilicon.

The electrode layer 207 is made of Al or the like so as to have an ohmic contact with the $N^+$ layer 204c of the semiconductor layer 204.

The electrode layer 208 is made of a metal multilayered film so as to have an ohmic contact with the silicon substrate 202.

Figure 22:
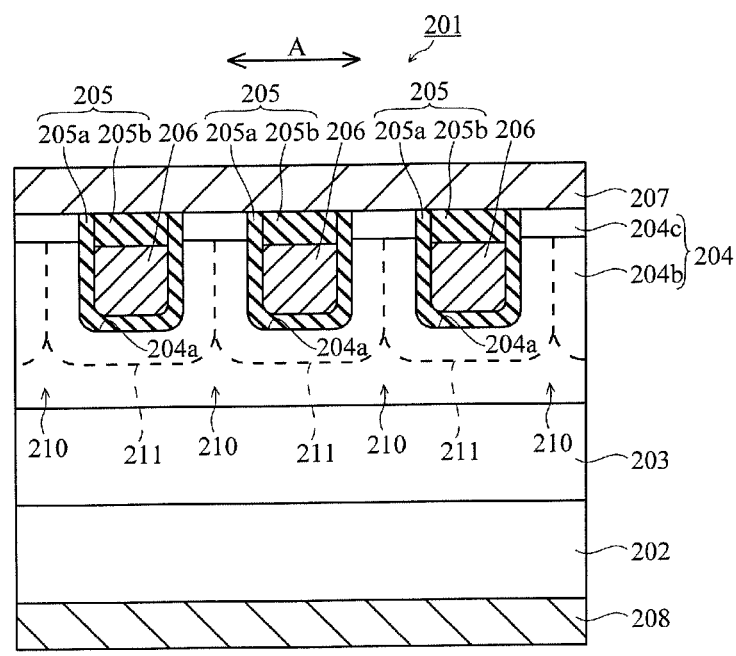
FIG. 22 is a cross sectional view illustrating a manner in which depletion layers are formed in a semiconductor layer of the semiconductor device according to the ninth embodiment illustrated in FIG. 21.

Here, in the ninth embodiment, when a negative potential is applied to the embedded electrode 206, as illustrated in FIG. 22, a depletion layer 211 with decreased majority carrier (electrons) is formed around every trench 204a (embedded electrode 206). The neighboring depletion layers 211 are connected and overlapped with each other so as to block each region between the neighboring trenches 204a (embedded electrode 206), so that the depletion layer 211 is formed from the trench 204a (embedded electrode 206) to the neighboring trenches 204a (embedded electrode 206). In this case, the channel 210 between the neighboring trenches 204a (embedded electrode 206) is blocked with the depletion layer 211 so as to be turned off (in which the current flowing through the channel 210 is interrupted). Therefore, current does not flow between the electrode layer 207 and the electrode layer 208 also when a negative potential is applied to the electrode layer 207 ($N^+$ layer 204c in the semiconductor layer 204) and a positive potential is applied to the electrode layer 208 (silicon substrate 202). In other words, current does not flow in the bipolar transistor (that is constituted of the $N^+$ type silicon substrate 202, the P type semiconductor layer 203 and the N type semiconductor layer 204).

In addition, in the ninth embodiment, when a positive potential is applied to the embedded electrode 206, as illustrated in FIG. 21, the depletion layer 211 (see FIG. 22) is not formed around each of the trenches 204a (embedded electrode 206). In other words, the depletion layer 211 formed around the trench 204a is deleted. In this case, in the ninth embodiment, the channel 210 is turned on (in which current flows through the channel 210) in every region between the neighboring trenches 204a (embedded electrode 206). Therefore, current flows between the electrode layer 207 and the electrode layer 208 when a negative potential is applied to the electrode layer 207 ($N^+$ layer 204c in the semiconductor layer 204) and a positive potential is applied to the electrode layer 208 (silicon substrate 202). In other words, current flows in the bipolar transistor (that is constituted of the $N^+$ type silicon substrate 202, the P type semiconductor layer 203 and the N type semiconductor layer 204).

In this way, in the ninth embodiment, a formation state of the depletion layer 211 formed around the trench 204a (embedded electrode 206) changes in accordance with the applied voltage (potential) to the embedded electrode 206.

Figure 23:
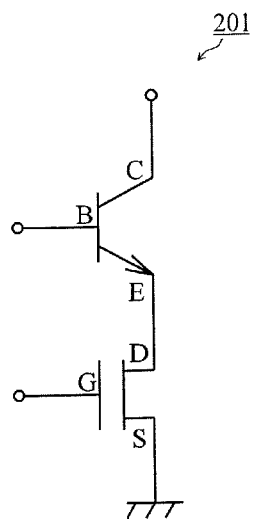
FIG. 23 is a diagram illustrating an equivalent circuit of the semiconductor device according to the ninth embodiment illustrated in FIG. 21.

In the ninth embodiment, it is supposed that the semiconductor layer 203 is connected to another driving power supply (not shown) separately from the embedded electrode 206 and the electrode layers 207 and 208. Further, it is supposed that the silicon substrate 202 (electrode layer 208) is a collector (C), the semiconductor layer 203 is a base (B), the $N^-$ layer 204b of the semiconductor layer 204 is an emitter (E) and a drain (D), the $N^+$ layer 204c (electrode layer 207) of the semiconductor layer 204 is a source (S), and the embedded electrode 206 is a gate (G). Then, the semiconductor device 201 can be regarded to have a circuit in which the bipolar transistor (that is constituted of the silicon substrate 202, the semiconductor layer 203 and the semiconductor layer 204) connected to a switching mechanism (transistor constituted of the $N^-$ layer 204b, the $N^+$ layer 204c and the embedded electrode 206), as illustrated in FIG. 23. In other words, the semiconductor device 201 can be used as a bipolar transistor having a switching function. Note that when the semiconductor device 201 is used as a bipolar transistor having a switching function, the semiconductor layer 203 is formed so as to have a relatively small thickness (approximately 0.5 to 10 µm).

Figure 24:
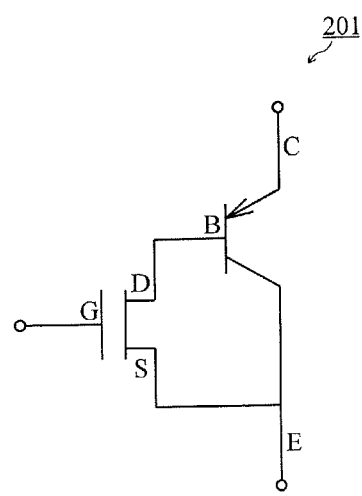
FIG. 24 is a diagram illustrating an equivalent circuit of the semiconductor device according to the ninth embodiment illustrated in FIG. 21.

In contrast, in the ninth embodiment, it is supposed that the semiconductor layer 203 is not connected to a driving power supply (not shown), the silicon substrate 202 (electrode layer 208) is a collector (C), the semiconductor layer 203 is a base (B) and a drain (D), the $N^-$ layer 204b of the semiconductor layer 204 is an emitter (E), the $N^+$ layer 204c (electrode layer 207) of the semiconductor layer 204 is a source (S), and the embedded electrode 206 is a gate (G). Then, the semiconductor device 201 can be regarded to have a circuit that is equivalent to an IGBT as illustrated in FIG. 24. In other words, the semiconductor device 201 can be used as an IGBT. Note that when the semiconductor device 201 is used as an IGBT, the semiconductor layer 203 is formed so as to have a relatively large thickness (approximately 10 to 50 µm).

In the ninth embodiment, as described above, when the embedded electrode 206 is at a negative potential, the depletion layer 211 is formed from the trench 204a to the neighboring trenches 204a, so that the channel 210 is turned off (in which the current flowing through the channel 210 is interrupted). If the embedded electrode 206 is at a positive potential, the depletion layer 211 is not formed in each region between the neighboring trenches 204a so that the channel 210 is turned on (in which current flows through the channel 210). Thus, by applying a negative potential or a positive potential to the embedded electrode 206, the channel 210 between the neighboring trenches 204a can be controlled to be turned off or to be turned on. In other words, the semiconductor device 201 can have a switching function. Further, in the above-mentioned structure, in the turned-on state, the entire region of each region between the neighboring trenches 204a in which the depletion layer 211 is not formed can function as the channel 210. Therefore, compared with the conventional semiconductor device (MOSFET) in which a very thin inversion layer functions as a channel, resistance against current flowing through the channel 210 can be reduced largely. Thus, compared with the conventional semiconductor device, on-resistance can be reduced largely.

In addition, in the ninth embodiment, the silicon substrate 202, the semiconductor layer 203 and the semiconductor layer 204 constitute the bipolar transistor. Therefore, when a voltage is applied to the bipolar transistor constituted of the silicon substrate 202, the semiconductor layer 203 and the semiconductor layer 204, the bipolar transistor can be controlled not to permit or to permit the current flow by the above-mentioned switching function. Thus, on and off of the bipolar transistor can be controlled by applying a positive potential or a negative potential to the embedded electrode 206 regardless of potentials applied to the silicon substrate 202 (electrode layer 208) and the $N^+$ layer 204c (electrode layer 207) of the semiconductor layer 204. As a result, it is not necessary to provide another switching mechanism for controlling on and off of the bipolar transistor and to connect the semiconductor device 201 to the switching mechanism, so that an increase in size of the entire device can be suppressed.

In addition, in the ninth embodiment, there are provided the $N^+$ type silicon substrate 202, the P type semiconductor layer 203 disposed on the silicon substrate 202, and the N type semiconductor layer 204 disposed on the semiconductor layer 203, so that a PNPN structure or an NPNP structure is not formed. Thus, it is possible to prevent a formation of a thyristor as a combination of a PNP transistor and an NPN transistor like an IGBT. Thus, it is possible to prevent occurrence of latch-up so that the semiconductor device can be used as an IGBT that permits more current to flow.

In addition, in the ninth embodiment, the $N^+$ layer 204c is formed on the $N^-$ layer 204b, and only the $N^+$ layer 204c out of the $N^-$ layer 204b and the $N^+$ layer 204c is made to contact with the electrode layer 207, so that a pitch of the trench 204a (approximately 0.4 to 2 μm) can be small compared with the conventional semiconductor device. Thus, the number of channels 210 in a predetermined region can be increased and the area of the channel 210 can be increased, so that on-resistance can be reduced more.

In addition, in the ninth embodiment, if the embedded electrode 206 is at a negative potential, the depletion layer 211 is formed around each of the plurality of trenches 204a, and the depletion layers 211 are connected to each other so as to block each region between the neighboring trenches 204a. Thus, when the embedded electrode 206 is at a negative potential, the depletion layer 211 can easily be formed from the trench 204a to the neighboring trenches 204a. Thus, by setting the embedded electrode 206 to a negative potential, the channel 210 can easily be turned off (in which the current flowing through the channel 210 is interrupted).

In addition, in the ninth embodiment, it is possible to prevent the depth of the trench 204a from being too large by forming the trench 204a in the semiconductor layer 204 so as not to reach the semiconductor layer 203. Thus, the trench 204a can easily be formed in the semiconductor layer 204.

In addition, in the ninth embodiment, the $N^+$ layer 204c having impurity concentration higher than that in the $N^-$ layer 204b of the semiconductor layer 204 is formed on the electrode layer 207 side (upper side) of the semiconductor layer 204, so that the semiconductor layer 204 ($N^+$ layer 204c) can easily have an ohmic contact with the electrode layer 207. Thus, on-resistance can easily be reduced more.

Tenth Embodiment

Figure 25:
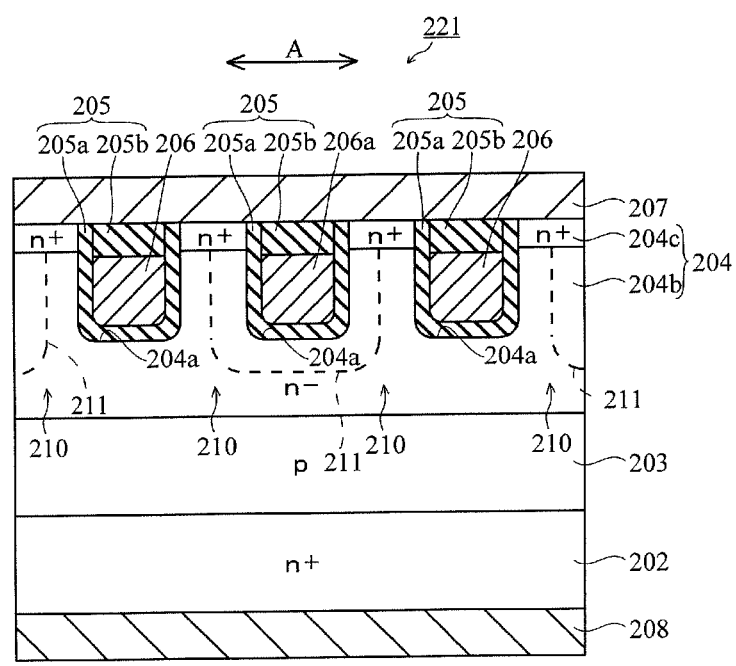
FIG. 25 is a cross sectional view illustrating a structure of a semiconductor device according to a tenth embodiment of the present invention.
Figure 26:
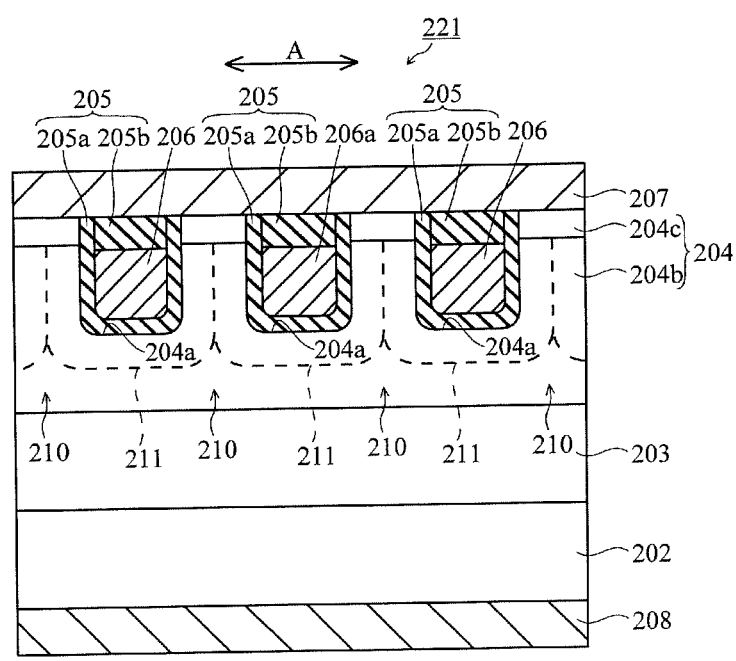
FIG. 26 is a cross sectional view illustrating a manner in which channels are interrupted in the semiconductor device according to the tenth embodiment illustrated in FIG. 25.

With reference to FIGS. 25 and 26, a tenth embodiment will describe a case different from the ninth embodiment, in which the plurality of trenches 204a are buried with the embedded electrodes 206 and embedded electrodes 206a to which a voltage is applied separately from the embedded electrode 206.

In a semiconductor device 221 according to the tenth embodiment of the present invention, as illustrated in FIG. 25, the embedded electrodes 206 and 206a are buried in the plurality of trenches 204a alternately. The embedded electrodes 206 and 206a are adapted to be applied with voltages separately from each other. Note that the embedded electrode 206 is an example of the "fifth embedded electrode" in the present invention, and the embedded electrode 206a is an example of the "sixth embedded electrode" in the present invention.

In addition, in the tenth embodiment, when a negative potential is applied to the embedded electrodes 206 and 206a, as illustrated in FIG. 26, the depletion layer 211 with decreased majority carrier (electrons) is formed around every trench 204a (embedded electrodes 206 and 206a). The neighboring depletion layers 211 are connected and overlapped with each other so as to block each region between the neighboring trenches 204a (embedded electrodes 206 and 206a), so that the depletion layer 211 is formed from the trench 204a (embedded electrodes 206 and 206a) to the neighboring trenches 204a (embedded electrodes 206 and 206a). In this case, the channel 210 between the neighboring trenches 204a (embedded electrodes 206 and 206a) is blocked with the depletion layer 211 so as to be turned off (in which the current flowing through the channel 210 is interrupted). Therefore, current does not flow between the electrode layer 207 and the electrode layer 208 also when a negative potential is applied to the electrode layer 207 ($N^+$ layer 204c in the semiconductor layer 204) and a positive potential is applied to the electrode layer 208 (silicon substrate 202). In other words, current does not flow in the bipolar transistor (that is constituted of the $N^+$ type silicon substrate 202, the P type semiconductor layer 203 and the N type semiconductor layer 204).

In addition, in the tenth embodiment, when a positive potential is applied to the embedded electrode 206 and a negative potential is applied to the embedded electrode 206a, as illustrated in FIG. 25, the depletion layer 211 is not formed around the trench 204a buried with the embedded electrode 206. In contrast, the depletion layer 211 is formed around the trench 204a buried with the embedded electrode 206a. In this case, in the tenth embodiment, the region without the depletion layer 211 is formed in the region between the neighboring trenches 204a (embedded electrodes 206 and 206a), so that the channel 210 is turned on (in which current flows through the channel 210). Therefore, current flows between the electrode layer 207 and the electrode layer 208 when a negative potential is applied to the electrode layer 207 ($N^+$ layer 204c in the semiconductor layer 204) and a positive potential is applied to the electrode layer 208 (silicon substrate 202). In other words, current flows in the bipolar transistor (that is constituted of the $N^+$ type silicon substrate 202, the P type semiconductor layer 203 and the N type semiconductor layer 204).

Note that other structure of the tenth embodiment is the same as the ninth embodiment.

In addition, the effect of the tenth embodiment is the same as that of the ninth embodiment.

Eleventh Embodiment

Figure 27:
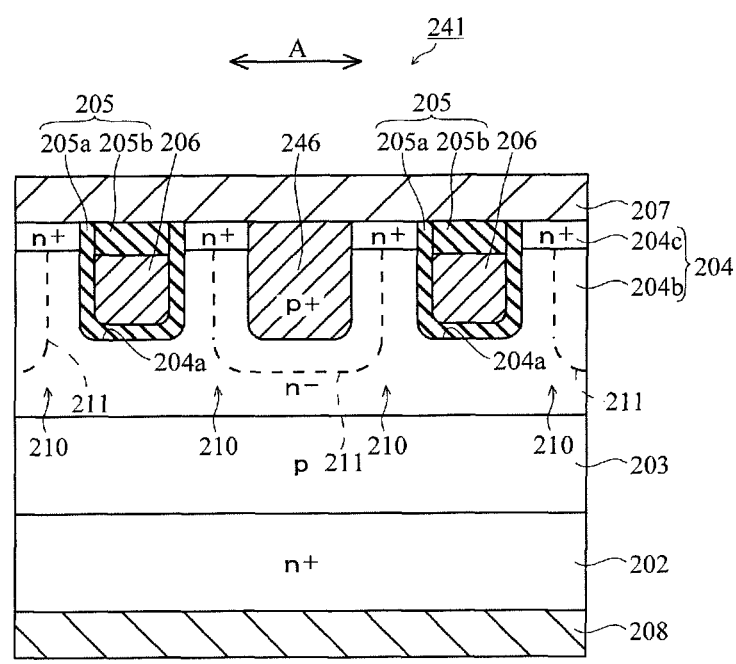
FIG. 27 is a cross sectional view illustrating a structure of a semiconductor device according to an eleventh embodiment of the present invention.
Figure 28:
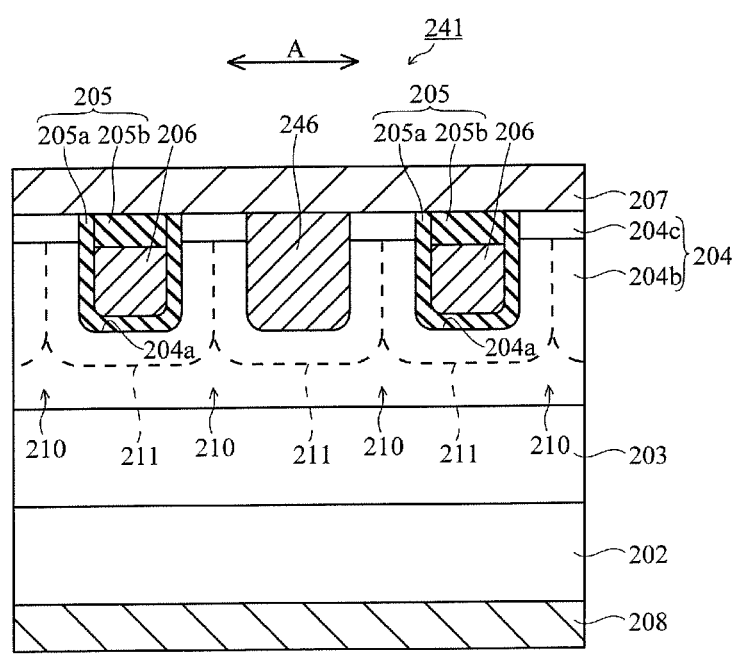
FIG. 28 is a cross sectional view illustrating a manner in which channels are interrupted in the semiconductor device according to the eleventh embodiment illustrated in FIG. 27.

With reference to FIGS. 27 and 28, an eleventh embodiment will describe a case different from the ninth embodiment, in which a $P^+$ type diffusion layer 246 is formed between the neighboring trenches 204a.

As illustrated in FIG. 27, in a semiconductor device 241 according to the eleventh embodiment of the present invention, the semiconductor layer 204 further includes, in addition to the plurality of trenches 204a, the $P^+$ type diffusion layer 246 in which P type impurity is doped at high concentration. The $P^+$ type diffusion layer 246 is disposed in each region between the neighboring trenches 204a with a predetermined space to the trench 204a. In addition, the depletion layer 211 is formed around the $P^+$ type diffusion layer 246 regardless of potentials to be applied to the electrode layers 207 and 208 and the embedded electrode 206. In addition, the $P^+$ type diffusion layer 246 has an ohmic contact with the electrode layer 207. Note that the P+ type diffusion layer 246 is an example of the "diffusion layer" in the present invention.

In addition, in the eleventh embodiment, when a negative potential is applied to the embedded electrode 206, as illustrated in FIG. 28, the depletion layer 211 with decreased majority carrier (electrons) is formed around every trench 204a (embedded electrode 206). In this case, the depletion layer 211 is formed also around the P+ type diffusion layer 246. Thus, the neighboring depletion layers 211 are connected and overlapped with each other so as to block each region between the neighboring trenches 204a (embedded electrode 206), so that the depletion layer 211 is formed from the trench 204a (embedded electrode 206) to the neighboring trenches 204a (embedded electrode 206). In this case, the channel 210 between the neighboring trenches 204a (embedded electrode 206) is blocked with the depletion layer 211 so as to be turned off (in which the current flowing through the channel 210 is interrupted). Therefore, current does not flow between the electrode layer 207 and the electrode layer 208 also when a negative potential is applied to the electrode layer 207 (N+ layer 204c in the semiconductor layer 204) and a positive potential is applied to the electrode layer 208 (silicon substrate 202). In other words, current does not flow in the bipolar transistor (that is constituted of the N+ type silicon substrate 202, the P type semiconductor layer 203 and the N type semiconductor layer 204).

In addition, in the eleventh embodiment, when a positive potential is applied to the embedded electrode 206, as illustrated in FIG. 27, the depletion layer 211 is not formed around the trench 204a buried with the embedded electrode 206. In contrast, the depletion layer 211 is formed around the P+ type diffusion layer 246. In this case, in the eleventh embodiment, the region without the depletion layer 211 is formed in the region between the neighboring trenches 204a (embedded electrode 206), so that the channel 210 is turned on (in which current flows through the channel 210). Therefore, current flows between the electrode layer 207 and the electrode layer 208 when a negative potential is applied to the electrode layer 207 (N+ layer 204c in the semiconductor layer 204) and a positive potential is applied to the electrode layer 208 (silicon substrate 202). In other words, current flows in the bipolar transistor (that is constituted of the N+ type silicon substrate 202, the P type semiconductor layer 203, and the N type semiconductor layer 204).

Note that other structure of the eleventh embodiment is the same as the ninth embodiment.

In addition, the effect of the eleventh embodiment is the same as that of the ninth embodiment.

Twelfth Embodiment

Figure 29:
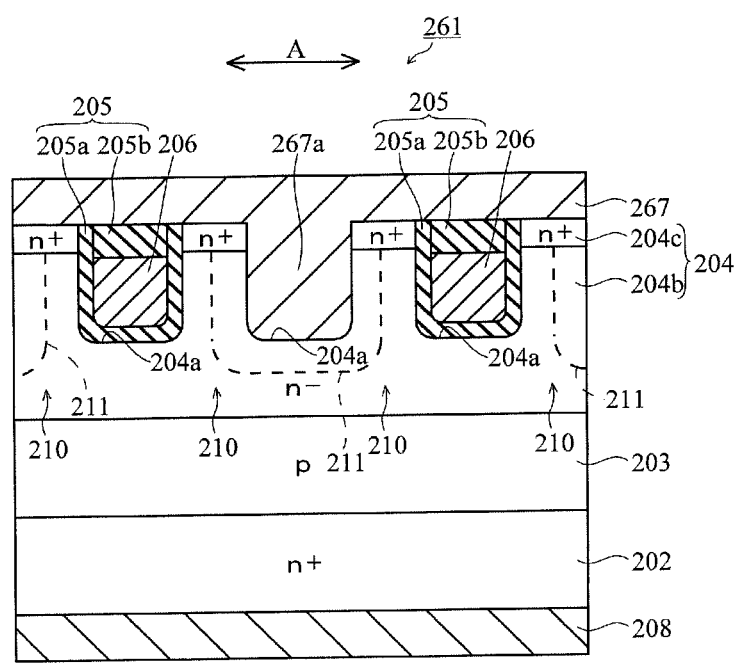
FIG. 29 is a cross sectional view illustrating a structure of a semiconductor device according to a twelfth embodiment of the present invention.
Figure 30:
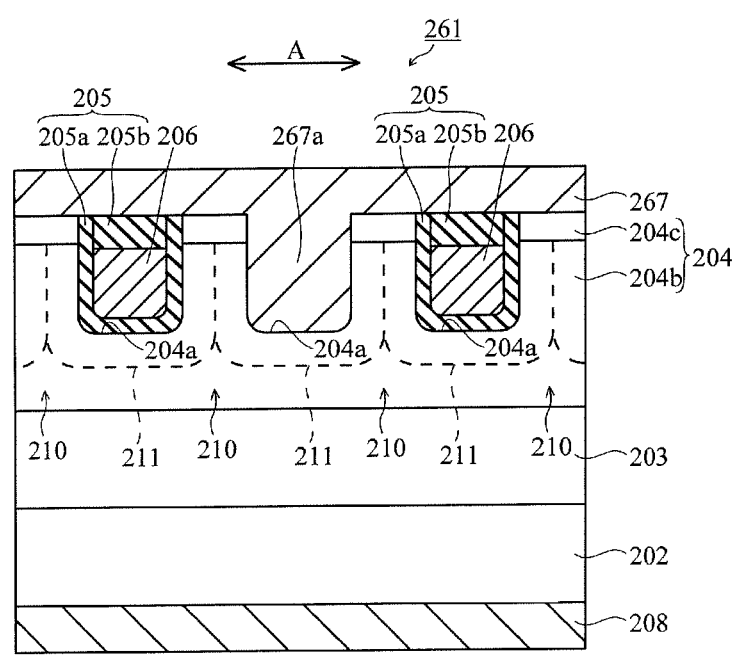
FIG. 30 is a cross sectional view illustrating a manner in which channels are interrupted in the semiconductor device according to the twelfth embodiment illustrated in FIG. 29.
Figure 31:
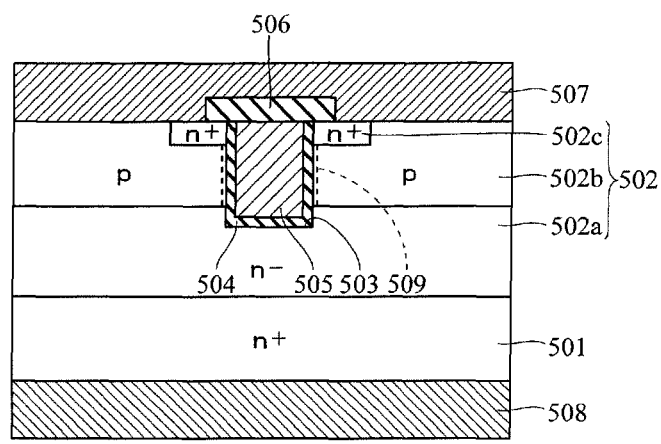
FIG. 31 is a cross sectional view illustrating a structure of a conventional MOSFET (semiconductor device).

With reference to FIGS. 29 and 30, a twelfth embodiment will describe a case different from the ninth embodiment, in which the embedded electrodes 206 and a part of an electrode layer 267 are buried in the plurality of trenches 204a.

In a semiconductor device 261 according to the twelfth embodiment of the present invention, as illustrated in FIG. 29, an embedded portion 267a of the electrode layer 267 disposed on the upper surface of the semiconductor layer 203 is disposed in the trench 204a that is a part of the plurality of trenches 204a. The embedded portions 267a and the embedded electrodes 206 are buried in the plurality of trenches 204a alternately. In addition, the embedded portion 267a has a Schottky contact with the N− layer 204b of the semiconductor layer 204 in the trench 204a. Note that the electrode layer 267 is an example of the "wiring layer" in the present invention. In addition, the embedded electrode 206 is an example of the "fifth embedded electrode" in the present invention, and the embedded portion 267a is an example of the "sixth embedded electrode" in the present invention.

In addition, the insulator film 205 is not disposed in the trench 204a buried with the embedded portion 267a.

In addition, in the twelfth embodiment, when a negative potential is applied to the embedded electrode 206 and a negative potential is applied to the electrode layer 267 (embedded portion 267a), as illustrated in FIG. 30, the depletion layer 211 with decreased majority carrier (electrons) is formed around every trench 204a (the embedded electrode 206 and the embedded portion 267a). In this case, the neighboring depletion layers 211 are connected and overlapped with each other so as to block each region between the neighboring trenches 204a, so that the depletion layer 211 is formed from the trench 204a to the neighboring trenches 204a. In this case, the channel 210 between the neighboring trenches 204a is blocked with the depletion layer 211 so as to be turned off (in which the current flowing through the channel 210 is interrupted). Therefore, current does not flow between the electrode layer 267 and the electrode layer 208 also when a negative potential is applied to the electrode layer 267 (N+ layer 204c of the semiconductor layer 204) and a positive potential is applied to the electrode layer 208 (silicon substrate 202). In other words, current does not flow in the bipolar transistor (that is constituted of the N+ type silicon substrate 202, the P type semiconductor layer 203 and the N type semiconductor layer 204).

In addition, in the twelfth embodiment, when a positive potential is applied to the embedded electrode 206 and a negative potential is applied to the electrode layer 267 (embedded portion 267a), as illustrated in FIG. 29, the depletion layer 211 is not formed around the trench 204a buried with the embedded electrode 206. In contrast, the depletion layer 211 is formed around the trench 204a buried with the embedded portion 267a. In this case, in the twelfth embodiment, the region without the depletion layer 211 is formed in the region between the neighboring trenches 204a, so that the channel 210 is turned on (in which current flows through the channel 210). Therefore, when a negative potential is applied to the electrode layer 267 (N+ layer 204c of the semiconductor layer 204) and a positive potential is applied to the electrode layer 208 (silicon substrate 202), current flows between the electrode layer 267 and the electrode layer 208. In other words, current flows in the bipolar transistor (that is constituted of the N+ type silicon substrate 202, the P type semiconductor layer 203, and the N type semiconductor layer 204).

Note that other structure of the twelfth embodiment is the same as the ninth embodiment.

In addition, the effect of the twelfth embodiment is the same as that of the ninth embodiment.

Note that the embodiments disclosed here are merely examples in all points and should not be interpreted as a limitation. The scope of the present invention is defined not by the above description of the embodiments but by the claims, which includes every modification within the meaning and the range that are equivalent to the claims.

For instance, the embodiments described above exemplify the case where the first, the third and the sixth conductivity types are the P type (P+ type), and the second, the fourth and the fifth conductivity types are the N type (N+ type, N− type), but the present invention is not limited to this structure. The first, the third and the sixth conductivity types may be the N type (N+ type), and the second, the fourth and the fifth conductivity types may be the P type (P+ type, P− type).

In addition, the embodiments described above exemplify the case where a negative potential is used as the first potential, and a positive potential is used as the second potential, but the present invention is not limited to this structure. As long as the first potential is lower than a threshold voltage and the second potential is higher than the threshold voltage, both the first potential and the second potential may be positive potentials or negative potentials.

In addition, the embodiments described above exemplify the case where polysilicon is used for the embedded electrode, but the present invention is not limited to this structure. A metal or other material may be used for the embedded electrode.

What is claimed is:

1. A semiconductor device comprising:
a first semiconductor layer of a first conductivity type;
a second semiconductor layer of a second conductivity type having a plurality of trenches, the second semiconductor layer being disposed on the first semiconductor layer; and
a plurality of embedded electrodes buried in the plurality of trenches of the second semiconductor layer and a wiring layer disposed on the second semiconductor layer, wherein
the first semiconductor layer and the second semiconductor layer constitute a PN diode,
the second semiconductor layer includes a first layer disposed on the first semiconductor layer, a second layer disposed on the first layer and having a higher impurity concentration than the first layer, and a third layer which is a high concentration impurity region disposed on the second layer and having a higher impurity concentration than the second layer,
the plurality of trenches are formed so as to penetrate the third and second layers,
each region between neighboring trenches serves as a channel,
to interrupt the channel, each region between the neighboring trenches is blocked by respective depletion layers formed around the neighboring trenches, whereas to open the channel, at least a part of the depletion layer formed around each trench is deleted,
each of the embedded electrodes is disposed on an inner surface of a respective one of the trenches via an insulator film,
disposed on each embedded electrode is an upper insulator film buried in a respective one of the trenches to a vicinity of respective upper end portion of the trench, the upper insulator film having a thickness at least as large as a thickness of the high concentration impurity region, and
the channel has a width equal to a width of the second layer and to a width of the third layer.

2. The semiconductor device according to claim 1, wherein when the embedded electrode is at a first potential, the depletion layer is formed from the trench to a neighboring trench, so that current flowing through the channel is interrupted, and
when the embedded electrode is at a second potential, the depletion layer is not formed in at least a part of the region between the neighboring trenches so that current can flow through the channel.

3. The semiconductor device according to claim 2, wherein if the second semiconductor layer is an N type semiconductor layer, the second potential is higher than the first potential, and
if the second semiconductor layer is a P type semiconductor layer, the second potential is lower than the first potential.

4. The semiconductor device according to claim 2, wherein if the embedded electrode is at the first potential, the depletion layer is formed around each of the plurality of trenches, and the depletion layers are connected to each other so as to block each region between the neighboring trenches.

5. The semiconductor device according to claim 1, wherein the trench is formed in the second semiconductor layer so as not to reach the first semiconductor layer.

6. The semiconductor device according to claim 1, wherein the channel is interrupted when all depletion layers formed around the plurality of trenches block regions between the neighboring trenches, and the channel is opened when all depletion layers formed around the plurality of trenches are deleted.

7. The semiconductor device according to claim 1, wherein
the plurality of embedded electrodes include two types that are first embedded electrodes and second embedded electrodes to which voltages are applied separately, and
the channel is interrupted when depletion layers formed around all of the plurality of trenches block regions between the neighboring trenches, and the channel is opened when depletion layers formed around those of the plurality of trenches where the first embedded electrodes are buried are deleted.

8. The semiconductor device according to claim 7, wherein the second embedded electrode has a Schottky contact with the second semiconductor layer inside the trench.

9. The semiconductor device according to claim 1, further comprising a diffusion layer of the first conductivity type that is formed in each region between the neighboring trenches of the second semiconductor layer so as to be disposed with a predetermined space to the neighboring trenches, wherein
to interrupt the channel, each region between the neighboring trenches is blocked with depletion layers formed around the neighboring trenches and around the diffusion layer, whereas to open the channel, the depletion layer formed around the neighboring trenches is deleted.

10. The semiconductor device according to claim 7, wherein the first and second embedded electrodes have a same size as seen in a sectional view.

11. The semiconductor device according to claim 1, wherein the second semiconductor layer includes an upper second semiconductor layer which contacts with side surface of the trench and a lower second semiconductor layer which contacts with bottom surface of the trench and which is arranged between the upper second semiconductor layer and the first semiconductor layer,
and wherein the upper second semiconductor layer has impurity concentration higher than that of the lower second semiconductor layer.

12. The semiconductor device according to claim 1, wherein the wiring layer has an ohmic contact with the high concentration impurity region.

13. The semiconductor device according to claim 1, wherein the wiring layer is made of Al.

14. The semiconductor device according to claim 1, wherein the first semiconductor layer and the second semiconductor layer are made of silicon.

15. The semiconductor device according to claim 14, wherein the first semiconductor layer is a silicon substrate of P type and the second semiconductor layer is an N type layer formed on the silicon substrate.

16. The semiconductor device according to claim 1, wherein the embedded electrode is made of polysilicon.

17. The semiconductor device according to claim 11, wherein a lower surface of the embedded electrode is positioned at the same level as or lower than a lower surface of the upper second semiconductor layer.

* * * * *